(12) United States Patent
Yokou et al.

(10) Patent No.: US 8,717,839 B2
(45) Date of Patent: May 6, 2014

(54) SEMICONDUCTOR DEVICE HAVING PLURAL PENETRATION ELECTRODES PENETRATING THROUGH SEMICONDUCTOR SUBSTRATE AND TESTING METHOD THEREOF

(75) Inventors: Hideyuki Yokou, Tokyo (JP); Yasuyuki Shigezane, Shizuoka (JP)

(73) Assignee: Elpida Memory, Inc., Tokyo (JP)

( * ) Notice: Subject to any disclaimer, the term of this patent is extended or adjusted under 35 U.S.C. 154(b) by 251 days.

(21) Appl. No.: 13/398,702

(22) Filed: Feb. 16, 2012

(65) Prior Publication Data

US 2012/0212272 A1 Aug. 23, 2012

(30) Foreign Application Priority Data

Feb. 22, 2011 (JP) ................................ 2011-035684

(51) Int. Cl.
| | |
|---|---|
| *G11C 29/00* | (2006.01) |
| *G11C 5/06* | (2006.01) |
| *G11C 7/06* | (2006.01) |
| *G11C 7/10* | (2006.01) |
| *G11C 29/02* | (2006.01) |

(52) U.S. Cl.
CPC .............. *G11C 29/00* (2013.01); *G11C 29/025* (2013.01)
USPC .... 365/201; 365/63; 365/189.05; 365/189.07

(58) Field of Classification Search
CPC ............................... G11C 29/00; G11C 29/025
USPC ........................................................ 365/201
See application file for complete search history.

(56) References Cited

U.S. PATENT DOCUMENTS

| | | | |
|---|---|---|---|
| 7,028,235 B1 | 4/2006 | Kato | |
| 8,498,831 B2* | 7/2013 | Ide et al. | .......................... 702/64 |
| 8,593,891 B2* | 11/2013 | Nishioka | ....................... 365/191 |
| 2005/0270859 A1 | 12/2005 | Kato | |
| 2011/0175639 A1* | 7/2011 | Yoko et al. | ............... 324/762.06 |
| 2011/0292708 A1* | 12/2011 | Kang et al. | ....................... 365/63 |

FOREIGN PATENT DOCUMENTS

JP     2002-221226 A     8/2000

* cited by examiner

*Primary Examiner* — Son Mai
(74) *Attorney, Agent, or Firm* — McGinn IP Law Group, PLLC

(57) ABSTRACT

Disclosed herein is a device that includes first and second current paths, first and second latch circuits electrically connected to the first and second current paths, respectively, a driver circuit supplying first data to the first latch circuit, and supplying second data representing a logical value opposite to a logical value of the first data to the second latch circuit, a control circuit controlling the driver circuit to be alternately and repeatedly in a first period in which the driver circuit supplies the first data to the first latch circuit and does not supply the second data to the second latch circuit, and in a second period in which the driver circuit supplies the second data to the second latch circuit and does not supply the first data to the first latch circuit, and a monitor circuit.

20 Claims, 14 Drawing Sheets

SEMICONDUCTOR DEVICE HAVING PLURAL PENETRATION ELECTRODES PENETRATING THROUGH SEMICONDUCTOR SUBSTRATE AND TESTING METHOD THEREOF

BACKGROUND OF THE INVENTION

1. Field of the Invention

The present invention relates to a semiconductor device and testing method thereof, and more particularly relates to a semiconductor device constituted by a plurality of core chips and an interface chip that controls the core chips, and a testing method thereof.

2. Description of the Related Art

Memory capacities required for semiconductor memory devices such as a DRAM (Dynamic Random Access Memory) are increasing year by year. To satisfy this requirement, a memory device called "multi chip package" having a plurality of memory chips stacked has been proposed in recent years. In the multi chip package, however, ordinary memory chips that can operate independently by themselves are used. The ordinary memory chip includes a so-called front end unit that establishes interface to outside (a memory controller, for example). Accordingly, a chip area that a memory core can be formed in each memory chip is limited by existence of the front end unit. It is therefore difficult to greatly increase a memory capacity of one memory chip.

Additionally, although the front end unit is a logic circuit, transistors including the front end unit are fabricated at the same time as transistors including a back end unit constituting a memory core. Therefore, it is difficult to speed-up the transistors of the front end unit.

To solve these problems, a method that enables to constitute one semiconductor memory device by integrating a front end unit and a back end unit on separate chips, respectively, and stacking these chips has been proposed. According to this method, the chip areas that the memory core can be formed become larger in the plural core chips, and therefore the memory capacity of one core chip can be increased. On the other hand, an interface chip that has the front end unit can be fabricated by a process different from the memory core, which allows the logic circuits to be formed by a high-speed transistor. Furthermore, because the plural core chips can be allocated to one interface chip, a semiconductor memory device with a quite large capacity and a high speed operation can be provided.

In a semiconductor device using an interface chip, adjacent chips are electrically connected to each other by a large number of through silicon vias penetrating through silicon substrates of core chips. Most of the through silicon vias are short-circuited to through silicon vias in other chips provided at same positions as seen in a planar view from a stacking direction. A current path or a current path line for connecting the interface chip to each core chip is formed by a plurality of through silicon vias electrically short-circuited one another.

Japanese Patent Application Laid-Open No. 2000-221226 discloses a technique of detecting short-circuit defects or the like of a plurality of bus lines that connect a measuring IC and a measurement target IC. With this technique, the measuring IC transmits data representing a predetermined logical value ("0" or "1") to the bus lines. The measurement target IC receives this data via the bus lines, inverts the logical value of the data, and returns data representing an inverted logical value. The measuring IC compares the logical value of the transmitted data with the logical value of the returned data, and determines that the data is normal when the logical values do not match and that the data is abnormal when the logical values match each other.

Meanwhile, in a semiconductor device using an interface chip, a short-circuit defect sometimes occurs between adjacent current paths or between a current path and a power supply wiring or ground wiring. The current path having short-circuit defects is detected in a testing process, and replaced by another normal current path in a relieving process.

The testing process, as in the technique of Japanese Patent Application Laid-Open No. 2000-221226 for example, could be configured that the measuring IC transmits data representing a predetermined logical value to one end of a current path, and the measurement target IC returns data representing an inverted logical value to the measuring IC from the other end of the current path, and thus the measuring IC detects a short-circuit defect that has occurred to the current path. Since it is preferable that short-circuit defects are detected in the interface chip, in the above case, a testing circuit is preferably constituted so that the interface chip serves as the measuring IC.

However, the above conventional technique has the following problems. That is, if the testing circuit is constituted as described above, it is necessary to provide circuits that perform a process of inverting the logical value in each core chip, which is the measurement target IC. This unfavorably leads to a reduction in a storage capacity per core chip. Therefore, there has been a demand for a detecting technique that does not require any provision of circuits that perform a process of inverting the logic value in each core chip.

SUMMARY

In one embodiment, there is provided a semiconductor device that includes: first and second current path lines each including at least one penetration electrode penetrating through a semiconductor substrate; first and second latch circuits coupled to the first and second current path lines, respectively; a driver circuit supplying first and second data to the first and second latch circuits, respectively, the second data representing a logical value opposite to a logical value of the first data; a control circuit controlling the driver circuit so that first and second periods are alternately repeated, the driver circuit supplying the first data to the first latch circuit without supplying the second data to the second latch circuit in the first period, and the driver circuit supplying the second data to the second latch circuit without supplying the first data to the first latch circuit in the second period; and a monitor circuit determining whether a logical value of a potential of the first current path line in the second period is equal to the logical value of the first data in a preceding first period, and whether a logical value of a potential of the second current path line in the first period is equal to the logical value of the second data in a preceding second period.

In another embodiment, there is provided a testing method for a semiconductor device that includes: providing a semiconductor device including first and second current path lines each including at least one penetration electrode penetrating through a semiconductor substrate, and first and second latch circuits coupled to the first and second current path lines, respectively; supplying a first data to the first latch circuit in a first cycle; stopping supplying the first data to the first latch circuit to bring the first path line into a floating state, and supplying a second data to the second latch circuit in a second cycle subsequent to the first cycle, the second data representing a logical value opposite to a logical value of the first data;

stopping supplying the second data to the second latch circuit to bring the second current path line into a floating state in a third cycle subsequent to the second cycle; determining, in the second cycle, whether a logical value of a potential of the first current path line is equal to the logical value of the first data in the first cycle; and determining, in the third cycle, whether a logical value of a potential of the second current path line is equal to the logical value of the second data in the second cycle.

In still another embodiment, there is provided a semiconductor device that includes: a plurality of terminals, the terminals being classified into first and second groups each including at least one of the terminals; a plurality of storage circuits each coupled to an associated one of the terminals and configured to hold a voltage level related to a logic level appearing at the associated one of the terminals; a driver configured to drive the terminals with first and second patterns, the first pattern comprising the first group being driven with one of first and second logic levels while bringing the second group into an eclectically floating state, the second pattern comprising the second group being driven with the other of the first and second logic levels while bringing the first group into an eclectically floating state, the driver being configured to execute one of first and second patterns at least once and the other of the first and second patterns at least twice with an intervention of execution of the one of the first and second patterns; and a monitor circuit configured to monitor a voltage level at each of the terminals.

DETAILED DESCRIPTION OF THE EMBODIMENTS

Figure 1:
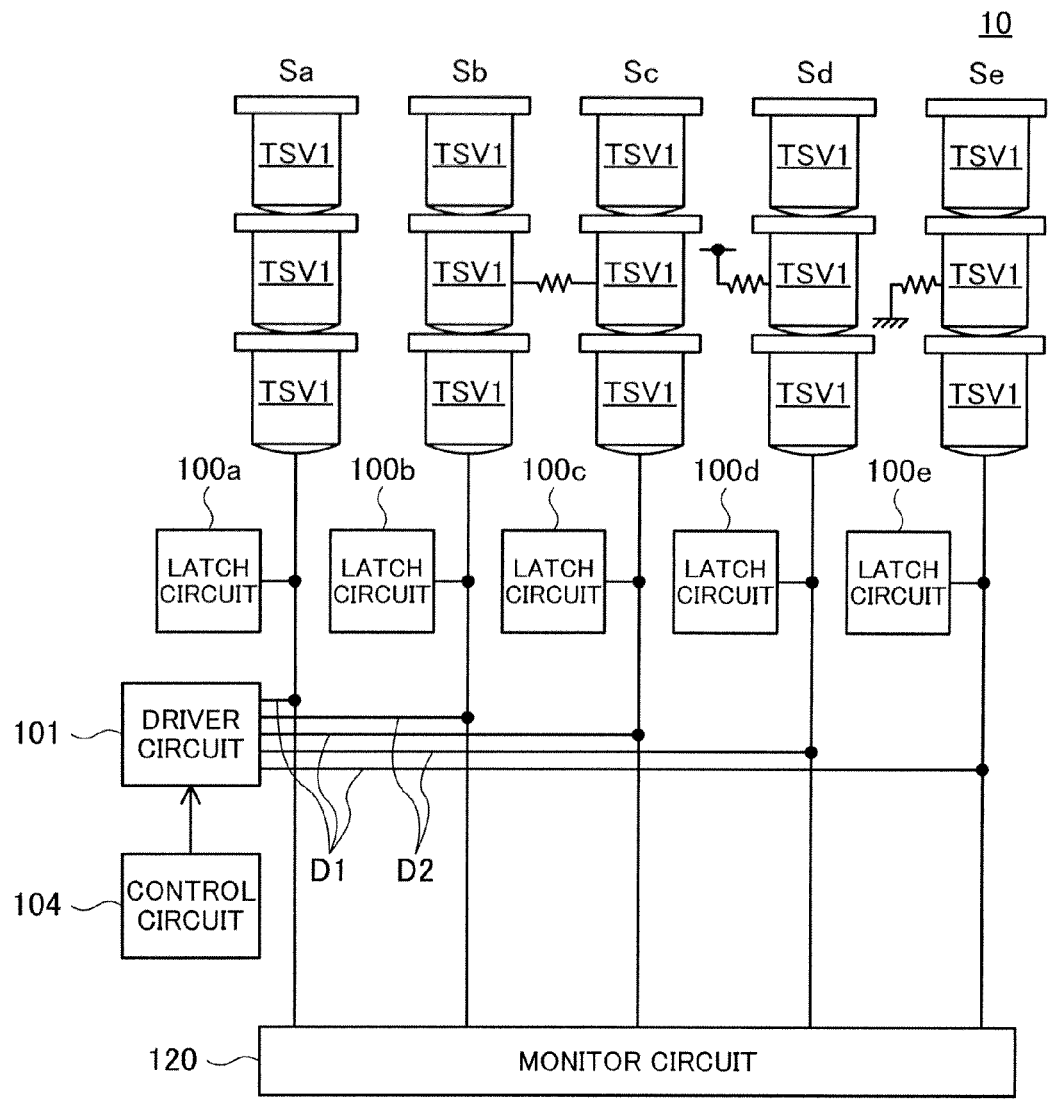
FIG. 1 is a schematic diagram for explaining an embodiment of the present invention.

Referring now to FIG. 1, a semiconductor device 10 according to the embodiment of the present invention includes first to fifth current paths or current path lines Sa to Se. Each of the first to fifth current paths Sa to Se includes a plurality of through silicon vias TSV1 connected in series. The through silicon via TSV1 is an electrode that is provided to penetrate a core chip as described later in detail. The first to fifth current paths Sa to Se electrically connect an interface chip to core chips via the through silicon vias TSV1.

The first to fifth current paths Sa to Se are arranged in line in this order. With this arrangement, the first current path Sa is adjacent to the second path Sb, the second current path Sb is adjacent to the third current path Sc, the third current path Sc is adjacent to the fourth current path Sd, and the fourth current path Sd is adjacent to the fifth current path Se.

As exemplified in FIG. 1, various short-circuit defects possibly occur to the first to fifth current paths Sa to Se. In an example shown in FIG. 1, a short-circuit defect between the adjacent current paths occurs between the second current path Sb and the third current path Sc. Also, the fourth current path Sd has a short-circuit defect with a power supply wiring. Further, the fifth current path Se has a short-circuit defect with a ground wiring. The present embodiment is described on the assumption that these short-circuit defects occur as shown in the example of FIG. 1.

An object of the present embodiment is to detect these short-circuit defects and relieve the current paths having the short-circuit defects by replacing the current paths by normal current paths. For that purpose, the semiconductor device 10 includes first to fifth latch circuits 100a to 100e, a driver circuit 101, a control circuit 104, and a monitor circuit 120.

The first to fifth latch circuits 100a to 100e are provided to correspond to the first to fifth current paths Sa to Se, respectively, and electrically connected to the corresponding current paths. Therefore, each of the latch circuits 100a to 100e functions to hold the potential of the corresponding current path to a potential supplied to the current path just before becoming a floating state when the current path turns into the floating state. For example, when the first current path Sa to which a high potential (a first logical value) has been supplied turns into a floating state, the first latch circuit 100a holds the potential of the first current path Sa to be high. This applies to a case where a low potential (a second logical value) is supplied to the first current path Sa.

Meanwhile, if a current path has a short-circuit defect between itself and the wiring (adjacent current path, power supply wiring, or ground wiring) to which a potential opposite in a logical value to the potential held by the current path is supplied, and a current outflow (or inflow) resulting from the short-circuit defect surpasses the holding capability of the latch circuit, then the latch circuit cannot hold the potential of the current path any longer. As a result, a transition from the held potential to the potential opposite to the held potential takes place in the current path. The semiconductor device 10 detects the short-circuit defect of the current path by detecting this transition. A detecting process is described next in detail.

The driver circuit 101 functions to supply first supply data D1 to the first latch circuit 100a, the third latch circuit 100c, and the fifth latch circuit 100e (hereinafter, collectively "first-type latch circuits"). Furthermore, the driver circuit 101 also functions to supply second supply data D2, which is opposite in a logical value to the first supply data D1, to the second latch circuit 100b and the fourth latch circuit 100d (hereinafter, collectively "second-type latch circuits").

Meanwhile, the control circuit 104 controls the driver circuit 101 to be alternately in a first period in which the driver circuit 101 supplies the first supply data D1 to the first-type latch circuits 100a, 100c, and 100e and does not supply the second supply data D2 to the second-type latch circuits 100b and 100d, and in a second period in which the driver circuit 101 supplies the second supply data D2 to the second-type latch circuits 100b and 100d and does not supply the first supply data D1 to the first-type latch circuits 100a, 100c, and 100e. The current path corresponding to the latch circuit to which no data is supplied is in a floating state.

Table 1 shows the potentials of the respective current paths as a result of the process explained above performed by the driver circuit 101 and the control circuit 104. Cycles C1 to C3 shown in Table 1 indicate continuous cycles in which the first and second periods go. The cycle C1 and C3 correspond to the first period, and the cycle C2 corresponds to the second period. In Table 1, the potential of the first supply data D1 is fixed to the high potential (the first logical value) and that of the second supply data D2 is fixed to the low potential (the second logical value).

TABLE 1

|  | C1<br>First period | C2<br>Second period | C3<br>First period |
| --- | --- | --- | --- |
| 100a, 100c, 100e | D1 (High) | — | D1 (High) |
| 100b, 100d | — | D2 (Low) | — |
| Sa |  | High | High |
| Sb |  | Low | Low -> High |
| Sc |  | High -> Low | High |
| Sd |  | Low | Low -> High |
| Se |  | High -> Low | High |

In the cycle C1, the driver circuit 101 supplies the high-potential first supply data D1 to the first-type latch circuits 100a, 100c, and 100e. Therefore, in the cycle C2, the potentials of the current paths Sa, Sc, and Se corresponding to the first-type latch circuits 100a, 100c, and 100e are supposed to be held high. However, as shown in FIG. 1, because the current paths Sc and Se have the short-circuit defects, the transition of potential from high to low takes place both in the current paths Sc and Se in the cycle C2. The transition of potential in the third current path Sc is due to the short-circuit defect between the second and third current paths Sb and Sc, and the low potential is supplied from the second current path Sb. The transition of potential in the fifth current path Se is due to the short-circuit defect between the fifth current path Se and the ground wiring, and the low potential is supplied from the ground wiring.

Similarly, in the cycle C3, the potentials of the current paths Sb and Sd corresponding to the second-type latch circuits 100b and 100d are supposed to be held low because the driver circuit 101 supplies the low-potential second supply data D2 to the second-type latch circuits 100b and 100d in the cycle C2. However, as shown in FIG. 1, because the current paths Sb and Sd have the short-circuit defects, the transition of potential from low to high takes place both in the current paths Sb and Sd in the cycle C3. The transition of potential in the second current path Sb is due to the short-circuit defect between the second and third current paths Sb and Sc, and the high potential is supplied from the third current path Sc. The transition of potential in the fourth current path Sd is due to the short-circuit defect between the fourth current path Sd and the power supply wiring, and the high potential is supplied from the power supply wiring.

The monitor circuit 120 functions to determine whether the potentials of the current paths Sa, Sc, and Se in the second period are equal in the logical values to that of the first supply data D1 in the previous first period, and to determine whether the potentials of the current paths Sb and Sd in the first period are equal in the logical values to that of the second supply data D2 in the previous second period. When a determination result indicates that the potential of a certain current path is not equal in the logical value to that of the first or second supply data D1, the monitor circuit 120 determines that the current path is a defect product having a short-circuit defect.

A determining process is described specifically with reference to Table 1. The logical values of the potentials of the current paths Sa, Sc, and Se in the cycle C2 corresponding to the second period are high, low, and low, respectively. The logical value of the first supply data D1 in the cycle C1 corresponding to the previous first period is high. Therefore, the monitor circuit 120 determines that the current paths Sc and Se are defect products. Similarly, the logical values of the potentials of the current paths Sb and Sd in the cycle C3 corresponding to the first period are both high. The logical value of the second supply data D2 in the cycle C2 corresponding to the previous second period is low. Therefore, the monitor circuit 120 determines that both the current paths Sb and Sd are defect products. This result matches the short-circuit defects shown in FIG. 1.

All of the first to fifth latch circuits 100a to 100e, the driver circuit 101, the control circuit 104, and the monitor circuit 120 can be provided in the interface chip. The semiconductor device 10 can thereby realize detection of short-circuit defects of the current paths without providing a circuit that performs the process of inverting logical values in each core chip.

Here, to perform the detecting process in the semiconductor device 10, it is necessary to set the current path corresponding to the latch circuit to which no data is supplied in a floating state. That is, each current path is connected to an internal circuit such as a memory core in each core chip. When the detecting process is to be performed, it is necessary to disconnect the current path from the internal circuit. This disconnecting process can be realized by providing a switching transistor between the current path and the internal circuit and turning off this transistor during the detecting process.

The semiconductor device 10 according to the embodiment of the present invention is described below. Prior to the explanations of characteristic parts (a configuration of detecting short-circuit defects of current paths and a testing method for the detection) of an embodiment of the present invention, a general explanation of a semiconductor device using an interface chip is made.

Figure 2:
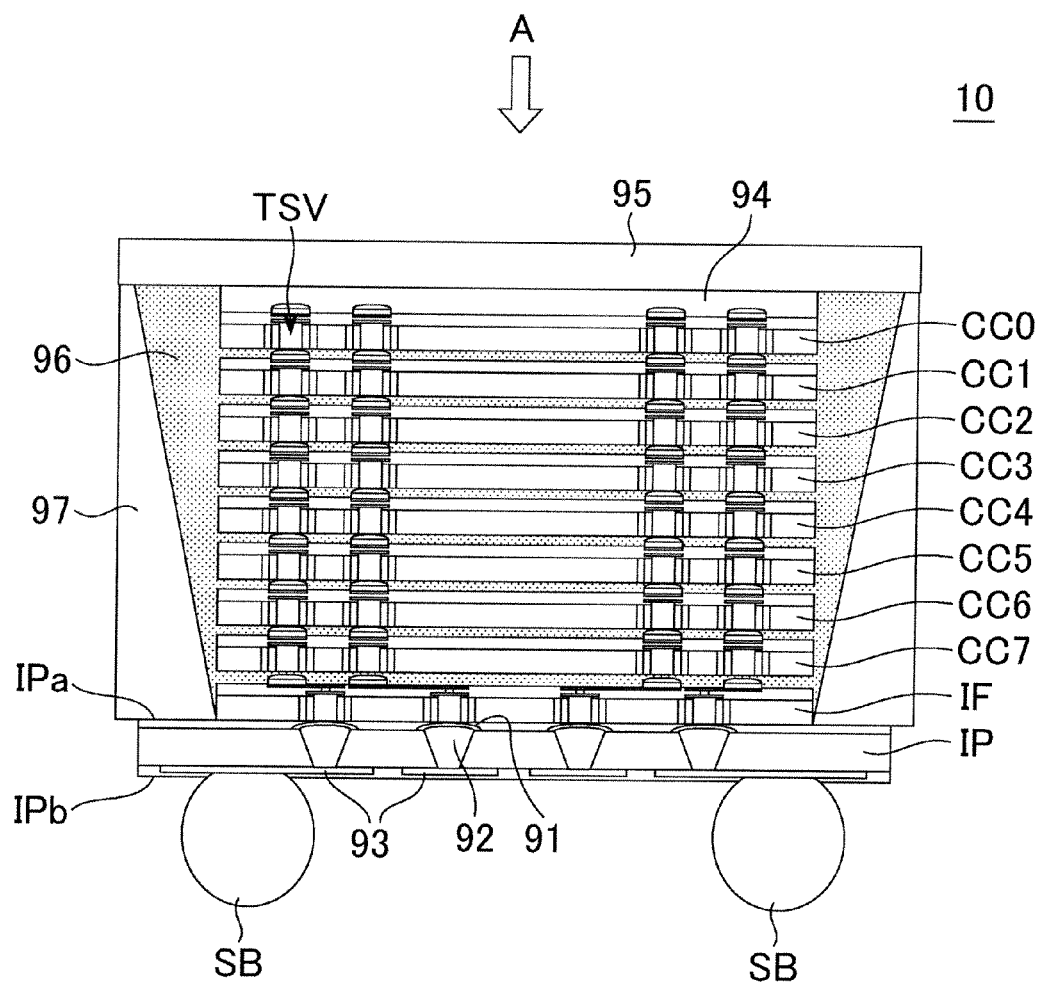
FIG. 2 is a schematic cross-sectional view showing the structure of a semiconductor memory device 10 according to an embodiment of the present invention.

Turning to FIG. 2, the semiconductor memory device 10 according to the preferred embodiment of the present invention has the structure where eight core chips CC0 to CC7 and an interface chip IF are stacked on an interposer IP. The core chips CC0 to CC7 have the same function and structure as one another. It is worth noting that the uppermost core chip CC0 may have a different structure from the other core chips CC1 to CC7. For example, the uppermost core chip CC0 may be thicker than the remaining core chips CC1 to CC7. The core chips CC0 to CC7 are manufactured using the same manufacture mask whereas the interface chip IF is manufactured using a manufacture mask different from that of the core chips CC0 to CC7. The core chips CC0 to CC7 and the interface chip IF are semiconductor chips using a silicon substrate and are electrically connected to adjacent chips in a vertical direction through plural Through Silicon Vias (TSV) penetrating the silicon substrate. The through silicon via may be referred to as a penetration electrode. The uppermost core chip CC0 may not have the through silicon via TSV. Meanwhile, the interposer IP is a circuit board that is made of a resin, and plural external terminals (solder balls) SB are formed in a back surface IPb of the interposer IP.

Each of the core chips CC0 to CC7 is a semiconductor chip on which only a back end unit of the circuit blocks included in the ordinary stand-alone 1 Gb DDR3 (Double Data Rate 3)-type SDRAM (Synchronous Dynamic Random Access Memory) normal is integrated. The SDRAM is a well-known and common memory chip that includes both of the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below.

The interface chip IF is a semiconductor chip in which only the front end unit is integrated. Accordingly, an operation frequency of the interface chip IF is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip.

In the semiconductor memory device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information. Read data for each I/O (DQ) that are supplied from the plural core chips to the interface chip in parallel is configured by a plural of bits with respect to each read command provided from the interface chip IF to the core chips. The bit number of this "a plural of bits" corresponds to a so-called prefetch data number to be well-known.

The interface chip IF functions as a common front end unit (a processing circuit processing signals to communicate with the eight core chips CC0 to CC7 and a processing circuit processing signals from/to the external.) for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor memory device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 2, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 2, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figures 3A, 3B, 3C:
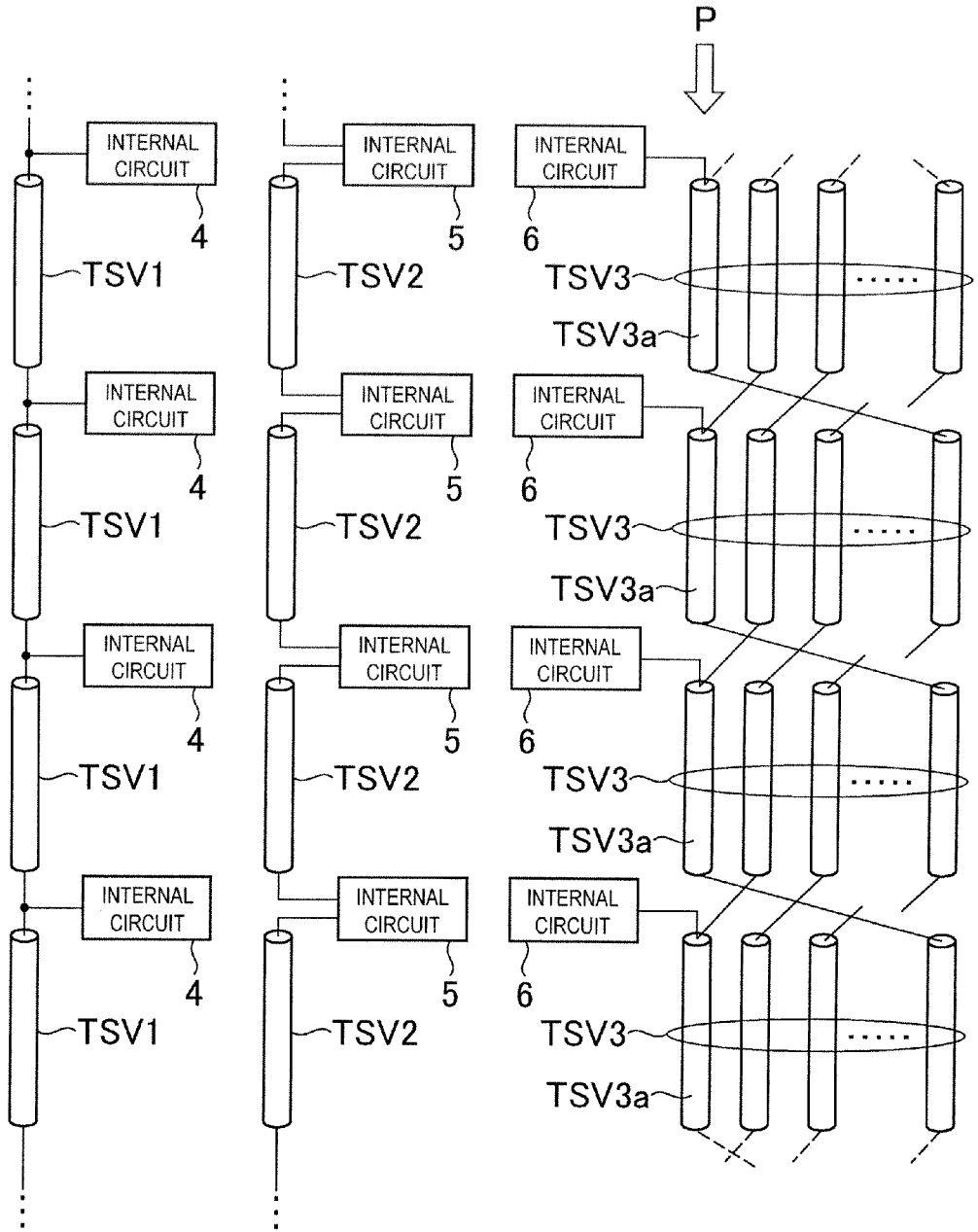
FIGS. 3A to 3C are diagram showing the various types of through silicon vias TSV provided in a core chip.

When most of the through silicon vias TSV provided in the core chips CC0 to CC7 are two-dimensionally viewed from a lamination direction, that is, viewed from an arrow A shown in FIG. 2, the through silicon vias TSV are short-circuited from the through silicon vias TSV of other layers provided at the same position. That is, as shown in FIG. 3A, the vertically disposed through silicon vias TSV1 that are provided at the same position in plain view are short-circuited, and one current path is configured by the through silicon vias TSV1. The through silicon vias TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 3A are commonly input to the internal circuits 4 of the core chips CC0 to CC7. Output signals (data etc.) that are supplied from the core chips CC0 to CC7 to the TSV1 are wired-ORed and input to the interface chip IF.

Meanwhile, as shown in FIG. 3B, the a part of through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits that are provided in the core chips CC0 to CC7 are cascade-connected through the through silicon vias TSV2 and the current path configured by the through silicon vias TSV2 includes the internal circuits 5. This kind of through silicon vias TSV2 is used to sequentially transmit predetermined information to the internal circuits 5 provided in the core chips CC0 to CC7. As this information, layer address information to be described below is exemplified.

Another through silicon via TSV group is short-circuited from the through silicon via TSVs of other layer provided at the different position in plain view, as shown in FIG. 3C. With respect to this kind of through silicon via TSV group 3, internal circuits 6 of the core chips CC0 to CC7 are connected to the TSV3a provided at the predetermined position P in plain view. Each of the current paths configured by the through silicon vias TSV3 is connected to the internal circuit 6 provided in only one of the core chips, respectively. Thereby, information can be selectively input to the internal circuit 6 provided in each of the core chips. As this information, defective chip information described below is exemplified.

As such, as types of the through silicon vias TSV provided in the core chips CC0 to CC7, three types (TSV1 to TSV3) shown in FIGS. 3A to 3C exist. As described above, most of the through silicon vias TSV are of a type shown in FIG. 2A, and an address signal, a command signal, and a clock signal are supplied from the interface chip IF to the core chips CC0 to CC7, through the through silicon vias TSV1 of the type shown in FIG. 3A. Read data and write data are also input to and output from the interface chip IF through the through silicon vias TSV1 of the type shown in FIG. 3A. Meanwhile, the through silicon vias TSV2 and through silicon vias TSV3 of the types shown in FIGS. 3B and 3C are used to provide individual information to the core chips CC0 to CC7 having the same structure.

Figure 4:
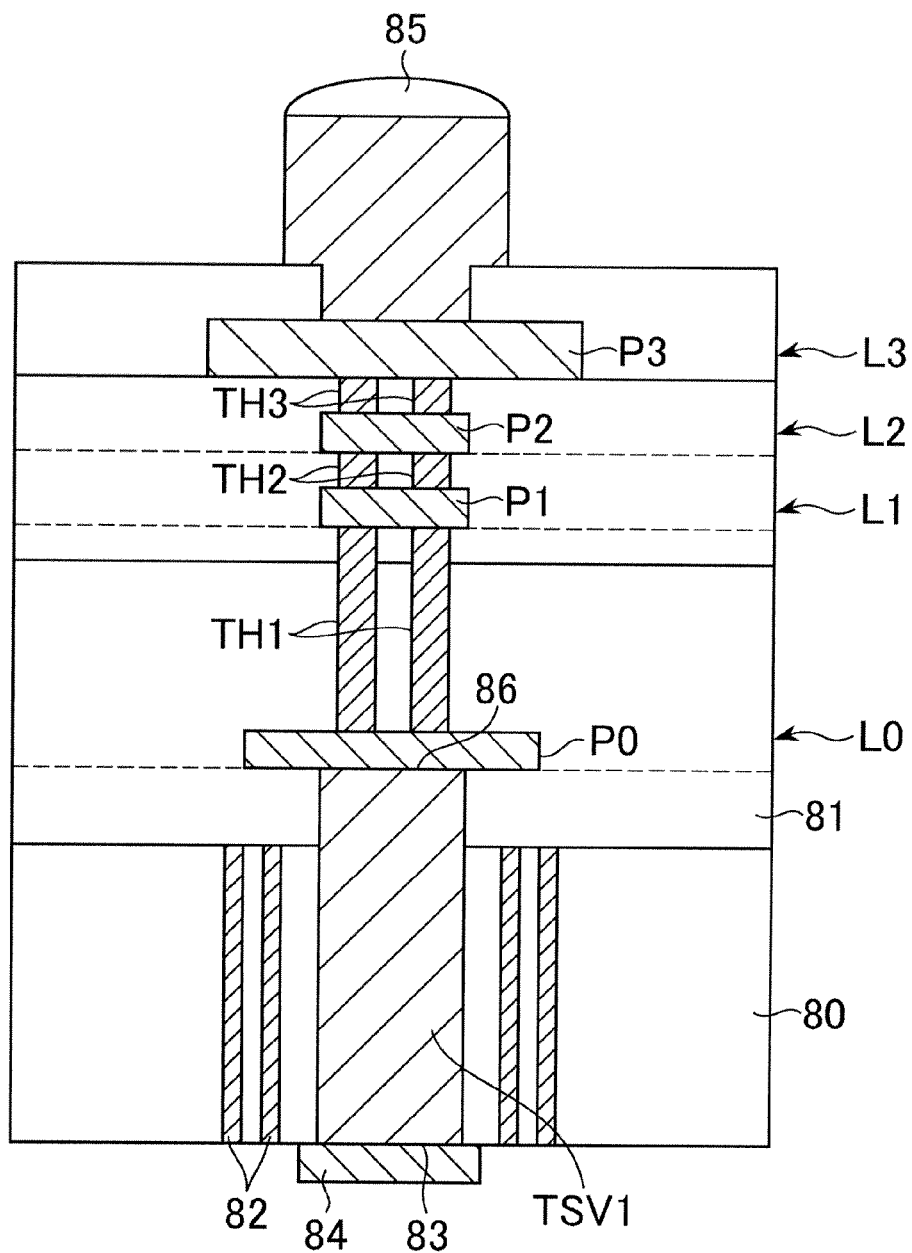
FIG. 4 is a cross-sectional view illustrating the structure of the through silicon via TSV1 of the type shown in FIG. 3A.

Turning to FIG. 4, the through silicon via TSV1 is provided to penetrate a silicon substrate 80 and an interlayer insulating film 81 provided on a surface of the silicon substrate 80. Around the through silicon via TSV1, an insulating ring 82 is provided. Thereby, the through silicon via TSV1 and a transistor region are insulated from each other. In an example shown in FIG. 4, the insulating ring 82 is provided double. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 5:
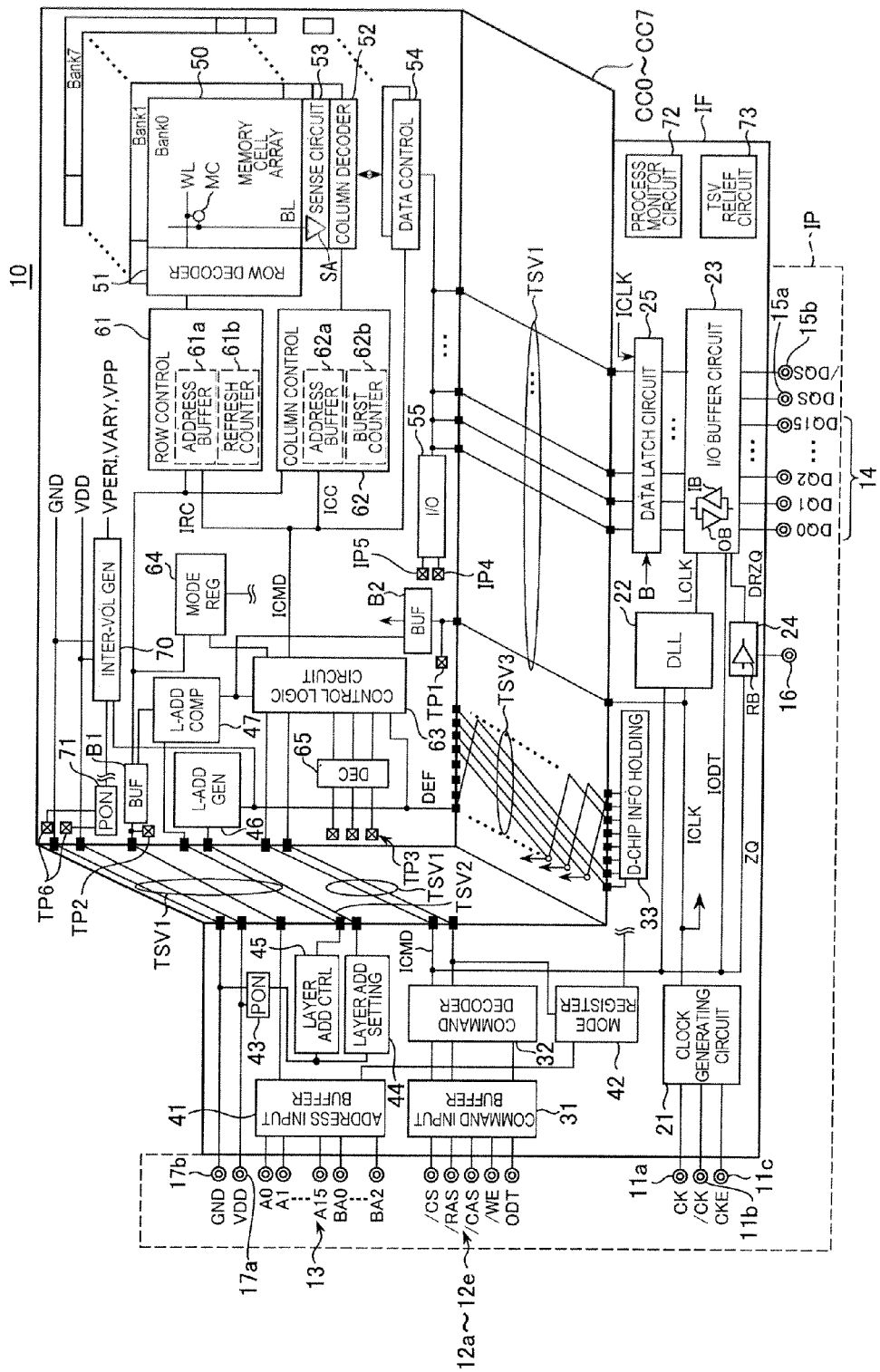
FIG. 5 is a block diagram illustrating the circuit configuration of the semiconductor memory device 10.

Turning to FIG. 5, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the through silicon vias TSV.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal OPT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the through silicon vias TSV.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the through silicon vias TSV. The address signals A0 to A15 are supplied to a mode register 42 provided in the interface chip IF, when the semiconductor memory device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different through silicon vias TSV, and partial parallel/serial conversion may be performed in the core chips CC0 to CC7 and the number of through silicon vias TSV that are needed for each DQ may be reduced. For example, all of data of 64 bits for each DQ do not need to be input/output using the different through silicon vias TSV, and 2-bit parallel/serial conversion may be performed in the core chips CC0 to CC7 and the number of through silicon vias TSV that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and thus a simple memory function is realized at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the through silicon vias TSV. The power-on detecting circuit 43 detects the supply of power. On detecting the supply of power, the power-on detecting circuit 43 activates a layer address control circuit 45 on the interface chip IF.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the through silicon vias TSV.

The interface chip IF is also provided with a layer address setting circuit 44. The layer address setting circuit 44 is connected to the core chips CC0 to CC7 through the through silicon vias TSV. The layer address setting circuit 44 is cascade-connected to the layer address generating circuit 46 of the core chips CC0 to CC7 using the through silicon via TSV2 of the type shown in FIG. 3B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the through silicon vias TSV. The defective chip information holding circuit 33 is connected to the core chips CC0 to CC7 while being shifted, using the through silicon via TSV3 of the type shown in FIG. 3C.

A process monitor circuit 72 and a TSV relief circuit 73 are also provided in the interface chip IF. The process monitor circuit 72 is a circuit measuring device characteristics of each core chip to code them. This coding enables the timing of each core chip to be adjusted. Specifically, an inverter chain circuit that can vary steps is provided in the interface chip IF and the core chip, the number of steps is adjusted so that their delay times are equal to each other, and a difference in the number of steps is coded. Details of the TSV relief circuit 73 is described later.

The above description is the outline of the connection relationship between the external terminals and the interface chip IF and the circuit configuration of the interface chip IF. Next, the circuit configuration of the core chips CC0 to CC7 will be described.

As shown in FIG. 5, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor memory device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the banks shares the external terminals (for example, plural control terminals and plural I/O terminals) of the semiconductor memory device 10. In the memory cell array 50, the plural word lines WL and the plural bit lines BL intersect each other, and memory cells MC are disposed at intersections thereof (in FIG. 5, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the through silicon via TSV, and the row address that is buffered by the address buffer 61a is supplied to the row decoder 51. The address signal that is supplied through the through silicon via TSV is supplied to the row control circuit 61 through the input buffer B1. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the through silicon via TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers, for example) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the through silicon via TSV.

The control logic circuit 63 receives an internal command ICMD supplied from the interface chip IF through the through silicon via TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the through silicon via TSV and a layer address LID (chip identification information) set to the layer address generating circuit 46.

In the layer address generating circuit 46, unique layer addresses are set to the core chips CC0 to CC7, respectively, at initialization. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the through silicon vias TSV of the type shown in FIG. 3B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the through silicon via TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the through silicon via TSV. As the defective chip signal DEF is supplied to the individual core chips CC0 to CC7 using the through silicon via TSV3 of the type shown in FIG. 3C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI ($\approx$VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the through silicon via TSV. The internal clock signal ICLK supplied through the through silicon via TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal, a test data, or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

The kind of the test pads TP is almost the same as those of the external terminals provided in the interposer IP. Specifically, the test pads TP include a test pad TP1 supplied with the clock signal, a test pad TP2 supplied with the address signal, test pads TP3 supplied with the command signal, a test pad TP4 for performing input/output of test data, a test pad TP5 for performing input/output of data strobe signal, test pads 6 for supplying power-supply voltages.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 GB are laminated, the semiconductor memory device 10 has a memory capacity of 8 GB in total. Because the chip selection signal/CS is input to one terminal (chip selection terminal), the semiconductor memory device is recognized as a single DRAM having the memory capacity of 8 GB, in view of the controller.

The configuration of detecting short-circuit defects of the current paths and the testing method therefor are explained below.

Figure 6:
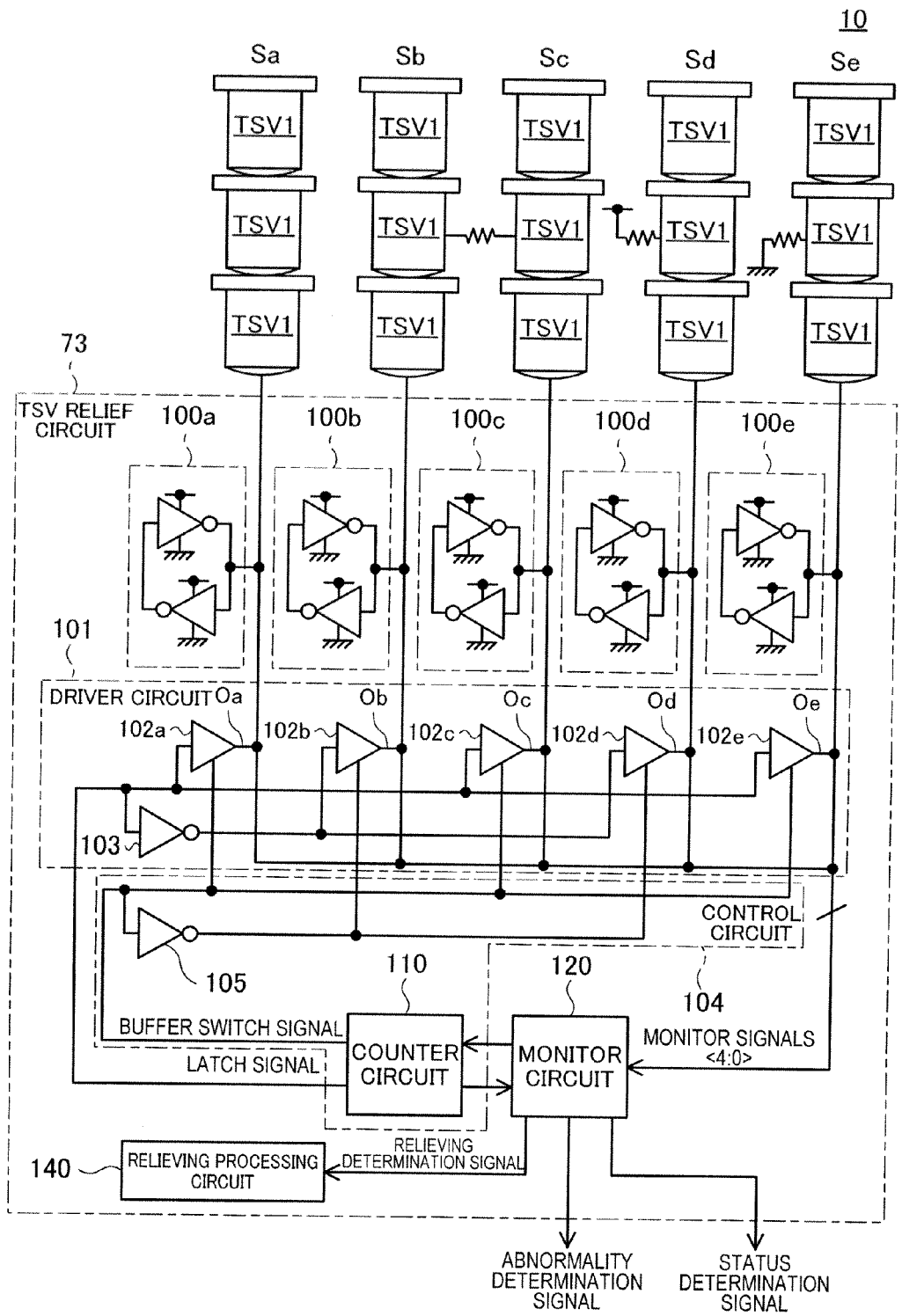
FIG. 6 is a block diagram showing a configuration of constituent elements detecting short-circuit defects of the current paths among the constituent elements of the semiconductor device 10.

FIG. 6 shows the first to fifth current paths Sa to Se as the current paths to be tested. The first to fifth current paths Sa to Se are the same as those shown in FIG. 1. The configuration is described on the assumption of conducting a test on these five current paths. However, the applicable range of the present invention is not limited to the test on the five current paths, and the present invention is also suitably applicable to a test on a plurality of current paths. The present invention is also applicable to a current path configured to include not only the through silicon vias TSV1 but also the through silicon vias TSV2 and TSV3.

As shown in FIG. 6, various constituent elements for defecting short-circuit defects of the current paths are included in the TSV relieving circuit 73 (FIG. 5) that is provided in the interface chip IF. Specifically, the TSV relieving circuit 73 includes a relieving processing circuit 140 as well as the first to fifth latch circuits 100a to 100e, the driver circuit 101, the control circuit 104, and the monitor circuit 120 described above.

Each of the first to fifth latch circuits 100a to 100e includes two loop-connected inverter circuits. A connection node between an output terminal of one inverter circuit and an input terminal of the other inverter circuit is electrically connected to the corresponding current path. When the driver circuit 101 supplies a potential to a current path, the corresponding latch circuit latches the potential. Therefore, even if the current path subsequently turns into a floating state, the potential of the current path is held to the potential just before the floating state.

Meanwhile, when the current path has a short-circuit defect with the wiring (adjacent current path, power supply wiring, or ground wiring) to which a potential opposite to the potential held by the current path is supplied, the corresponding latch circuit often cannot hold the potential of the current path. Specifically, in a case of the fifth current path Se, for example, even if the corresponding fifth latch circuit 100e holds a high potential of the current path Se, because the low potential is supplied to the fifth current path Se from the ground wiring, the high potential held by the fifth latch circuit 100e is often inverted to a low potential depending on the degree of a short-circuit.

Whether the potential held by the latch circuit is inverted due to the short-circuit defect or not depends on an inversion ratio of the latch circuit and the degree of the short-circuit defect. This feature is described in more detail below while referring to the fifth latch circuit 100e by way of example.

Figure 7:
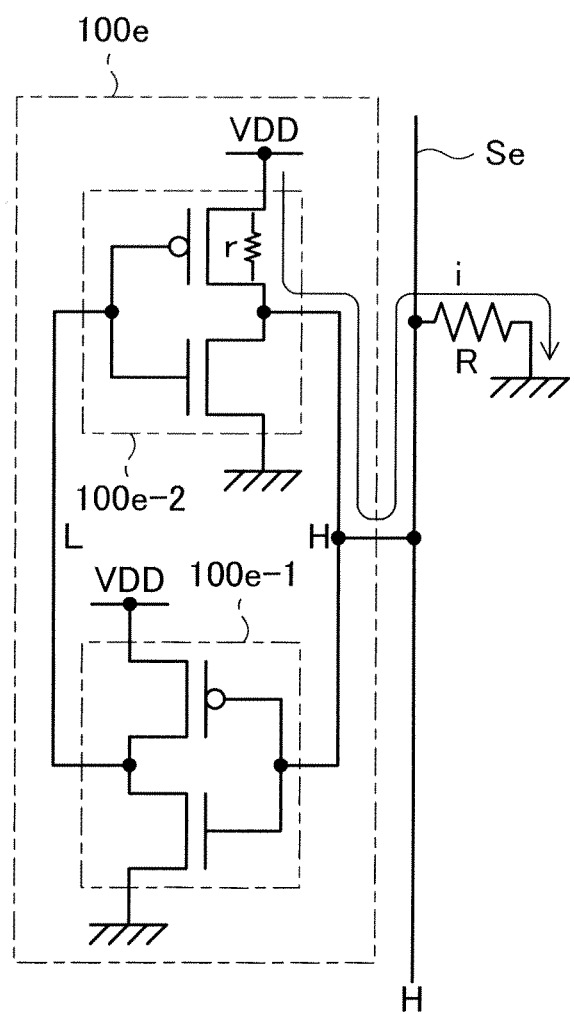
FIG. 7 shows a detailed internal configuration of the fifth latch circuit 100e shown in FIG. 6.

Turning to FIG. 7, the internal configurations of the other latch circuits are the same as that of the fifth latch circuit 100e although not shown in FIG. 7. As shown in FIG. 7, the fifth latch circuit 100e includes inverter circuits 100e-1 and 100e-2 each constituted by a CMOS. An input terminal of the inverter circuit 100e-1 and an output terminal of the inverter circuit 100e-2 are connected to the fifth current path Se.

It is assumed that the driver 101 supplies a high potential (H) to the fifth current path Se. On this assumption, the high potential is supplied to the input terminal of the inverter circuit 100e-1, and an N-channel MOS transistor constituting the inverter circuit 100e-1 is turned on. An output terminal of the inverter circuit 100e-1 is thereby connected to the ground wiring, so that a low potential (L) is supplied to an input terminal of the inverter circuit 100e-2. A P-channel MOS transistor constituting the inverter circuit 100-2 is thereby turned on, and the output terminal of the inverter circuit 100e-2 is connected to the power supply wiring. This connection is kept even after the driver circuit 101 stops supplying the potential, thus holding the potential of the fifth current path Se to be high.

In this case, if the fifth current path Se has a short-circuit defect between itself and the ground wiring as shown in FIG. 7, a current i shown therein flows from a source of the P-channel MOS transistor constituting the inverter circuit 100e-2 to the ground wiring. The flow of this current changes the potential of the fifth current path Se to VDD×R/(R+r), where R indicates a resistance between the fifth current path Se and the ground wiring, r indicates an ON resistance of the P-channel MOS transistor constituting the inverter circuit 100e-2, and VDD indicates a power supply potential supplied to the source of this P-channel MOS transistor. A wiring resistance is ignored in this case.

Providing that a potential of the input terminal of the inverter circuit 100e-1 necessary to invert the potential held by the fifth latch circuit 100e is $V_{INV}$, the potential held by the fifth latch circuit 100e is inverted when the following Expression (1) is satisfied.

$$VDD \times R/(R+r) < V_{INV} \quad (1)$$

The Expression (1) can be transformed to the following Expression (2). The right side of the Expression (2) represents the inversion ratio of the fifth latch circuit 100e and the left side represents the degree of the short-circuit defect. Therefore, as evident from the Expression (2), whether the potential held by the latch circuit is inverted due to the short-circuit defect or not depends on the inversion ratio of the latch circuit and the degree of the short-circuit defect.

$$r/R > VDD/V_{INV} - 1 \quad (2)$$

Referring back to FIG. 6, the driver circuit 101 includes first to fifth buffer circuits 102a to 102e and an inverter circuit 103. The first to fifth buffer circuits 102a to 102e are provided to correspond to the first to fifth current paths Sa to Se, respectively, and include output terminals to fifth output terminals) electrically connected to the corresponding current paths.

Figure 8:
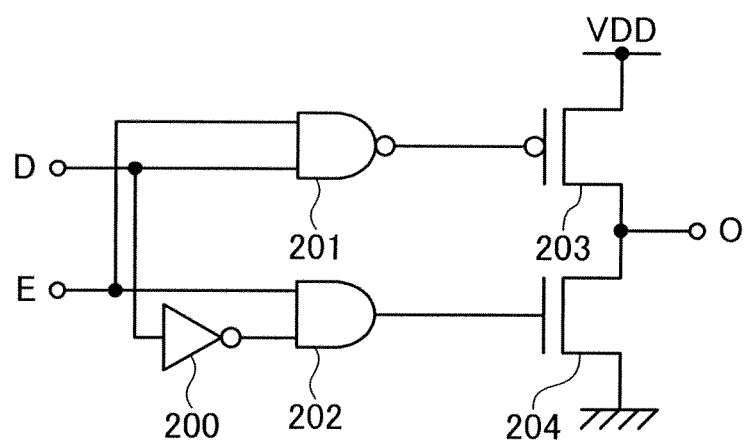
FIG. 8 shows an internal configuration of each of the first to fifth buffer circuits 102a to 102e shown in FIG. 6.

Turning to FIG. 8, each of the buffer circuits 102a to 102e is constituted as a structure of a so-called three-state buffer. That is, each buffer circuit includes an inverter circuit 200, a NAND circuit 201, an AND circuit 202, a P-channel MOS transistor 203, and an N-channel MOS transistor 204.

An input terminal of the inverter circuit 200 and one input terminal of the AND circuit 201 constitute a data terminal D of the buffer circuit. The other input terminal of the NAND circuit 201 and one input terminal of the AND circuit 202 constitute an enable terminal E of the buffer circuit. The other input terminal of the AND circuit 202 is connected to an output terminal of the inverter circuit 200. An output terminal of the NAND circuit 201 is connected to a gate of the P-channel MOS transistor 203, and an output terminal of the AND circuit 202 is connected to a gate of the N-channel MOS transistor 204. The P-channel MOS transistor 203 and the N-channel MOS transistor 204 are connected in series in this order between the power supply wiring supplied with the power supply potential VDD and the ground wiring. A connection point between the P-channel MOS transistor 203 and the N-channel MOS transistor 204 serves as an output terminal O of the buffer circuit.

With the configuration explained above, when the high potential is supplied to the enable terminal E, the buffer circuit outputs a signal indicating the same logical value as that of a signal supplied to the data terminal D from the output terminal O. On the other hand, when the low potential is supplied to the enable terminal E, the output terminal O turns into a high impedance state (a state where both the P-channel MOS transistor 203 and the N-channel MOS transistor 204 are turned off).

Referring back to FIG. 6, the driver circuit 101 is supplied with a latch signal, a buffer switch signal, and an inversion signal of the buffer switch signal from the control circuit 104. The control circuit 104 supplies the latch signal to the data terminals D of the first buffer circuit 102a, the third buffer circuit 102c, and the fifth buffer circuit 102e, respectively. The control circuit 104 also supplies the latch signal to an input terminal of the inverter circuit 103, and the inversion signal of the latch signal output from the inverter circuit 103 is supplied to the data terminals D of the second buffer circuit 102b and the fourth buffer circuit 104b, respectively. The control circuit 104 supplies the buffer switch signal to the enable terminals E of the first buffer circuit 102a, the third buffer circuit 102c, and the fifth buffer circuit 102e, respectively. The inversion signal of the buffer switch signal is supplied to the enable terminals E of the second buffer circuit 102b and the fourth buffer circuit 102d, respectively.

With the configuration explained above, when the potential of the buffer switch signal is high, signals (first supply data) equal in a logical value to the latch signal are output from the output terminals O of the first, third, and fifth buffer circuits 102a, 102c, and 102e, respectively. Furthermore, the output terminals O of the second and fourth buffer circuits 102b and 102d turn into a high impedance state. On the other hand, when the potential of the buffer switch signal is low, the output terminals O of the first, third, and fifth buffer circuits 102a, 102c, and 102e turn into a high impedance state. Moreover, signals (second supply data) indicating the inverted logical value of that of the latch signal are output from the output terminals O of the second and fourth buffer circuits 102b and 102d, respectively. The signals output from the output terminals O of the first to fifth buffer circuits 102a to 102e are hereinafter referred to as "output signals Oa to Oe", respectively.

As shown in FIG. 6, the control circuit 104 includes a counter circuit 110 and an inverter circuit 105. The counter circuit 110 functions to generate the latch signal and the buffer switch signal, and supplies both of the latch signal and the buffer signal to the driver circuit 101. The counter circuit 110 also supplies the buffer switch signal to an input terminal of the inverter circuit 105, and the inversion signal of the buffer switch signal output from the inverter circuit 105 is supplied to the driver circuit 101.

The monitor circuit 120 acquires monitor signals <4:0> indicating potentials of the first to fifth current paths Sa to Se, respectively, and determines whether each current path has a short-circuit defect based on these monitor signals.

In the present specification, "signals <n:0>" collectively indicate n+1 signals <0> to <n>.

The detailed configuration and function of the monitor circuit 120 and the function of the counter circuit 110 are now described with reference to FIGS. 9 and 10. It should be noted that, for the sake of explanations of the basic functions of an embodiment of the present invention, FIG. 10 is based on the assumption that the first to fifth current paths Sa to Se are all normal (have no short-circuit defects).

Figure 9:
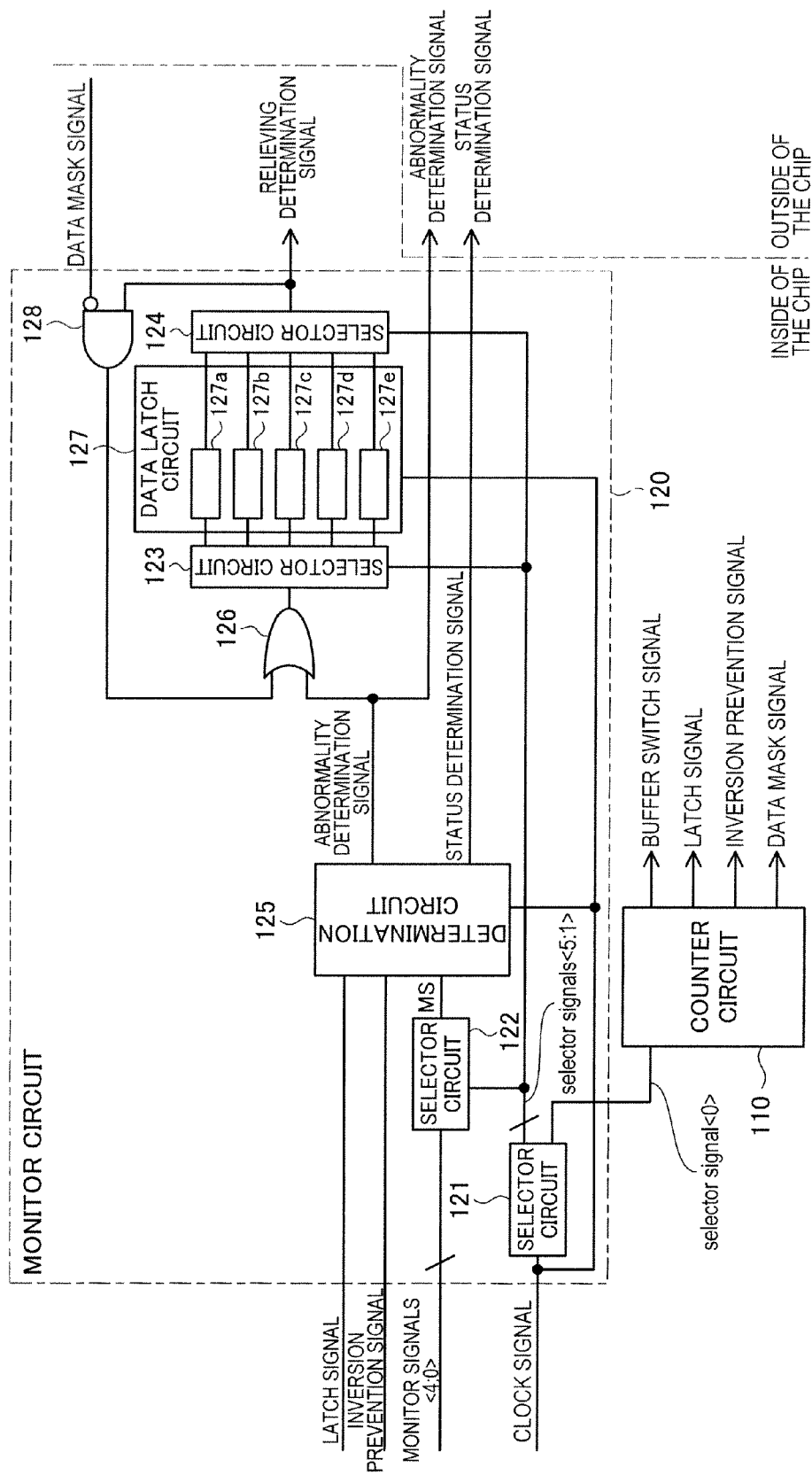
FIG. 9 shows an internal configuration of the monitor circuit 120 shown in FIG. 6.

As shown in FIG. 9, the monitor circuit 120 includes selector circuits 121 to 124, a determination circuit 125, an OR circuit 126, a data latch circuit 127, and an AND circuit 128.

Figure 10:
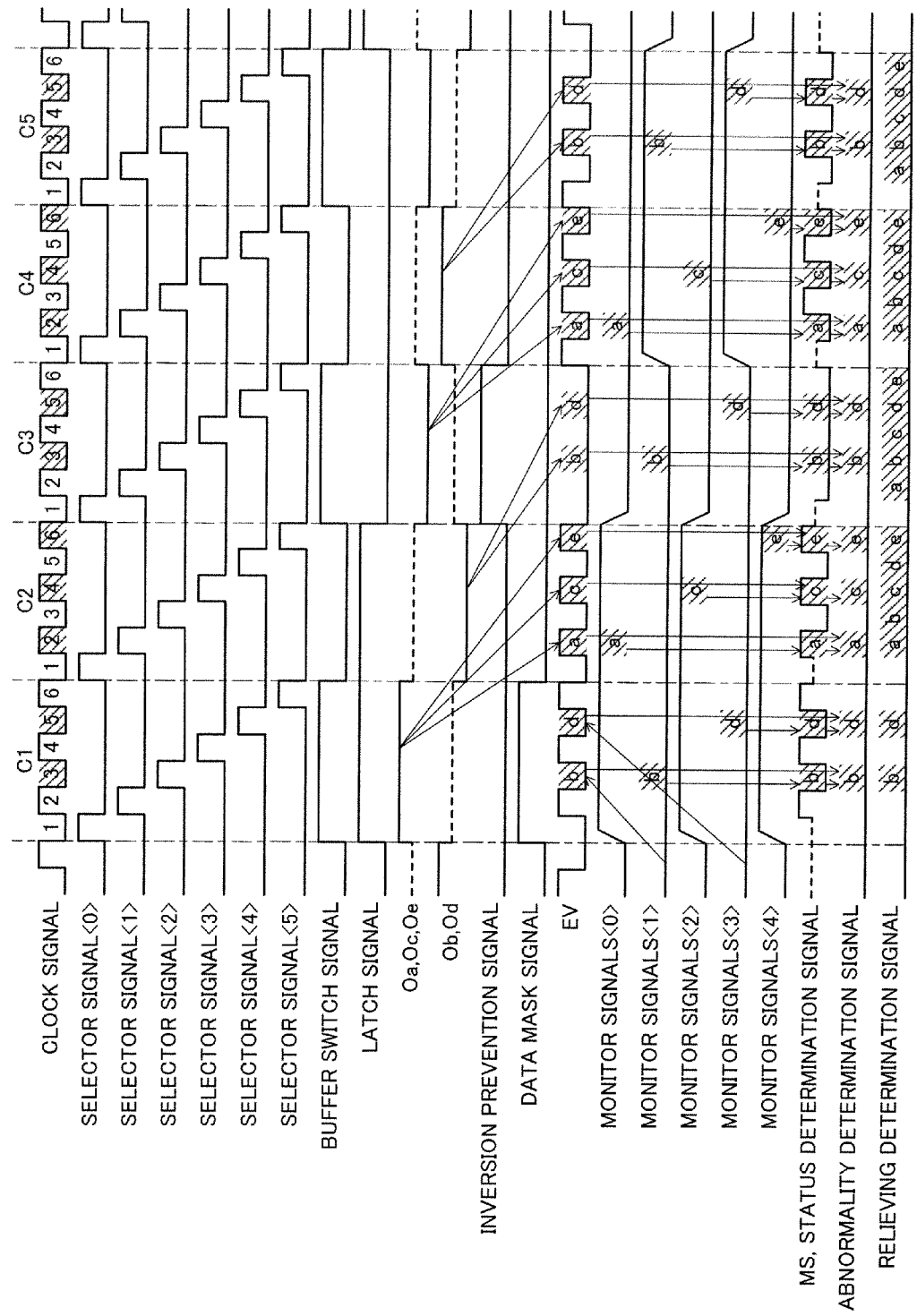
FIG. 10 is a timing chart of various signals related to the testing method.

A clock signal shown in FIG. 10 is supplied to the selector circuit 121. For example, this clock signal is the internal clock signal ICLK explained above. The selector circuit 121 generates selector signals <5:0> based on the supplied clock signal. As shown in FIG. 10, each of the selector signals <5:0> is a one-shot signal rising at intervals of three clocks and has a pulse width of a half-clock. The selector circuit 121 is configured to repeat a cycle in which the selector signals <0> to <5> rise in this order at least five times, as shown in FIG. 10. In FIG. 10, these five cycles are denoted by C1 to C5. As shown in FIG. 10, each cycle has a time width corresponding to six half-clocks. Periods corresponding to the six half-clocks in one cycle are hereinafter referred to as "first to sixth half-clock periods" in a temporal order, respectively.

The selector signal <0> is supplied to the counter circuit 110. The counter circuit 110 generates not only the buffer switch signal and the latch signal described above based on this selector signal <0> but also an inversion prevention signal and a data mask signal.

Figure 11:
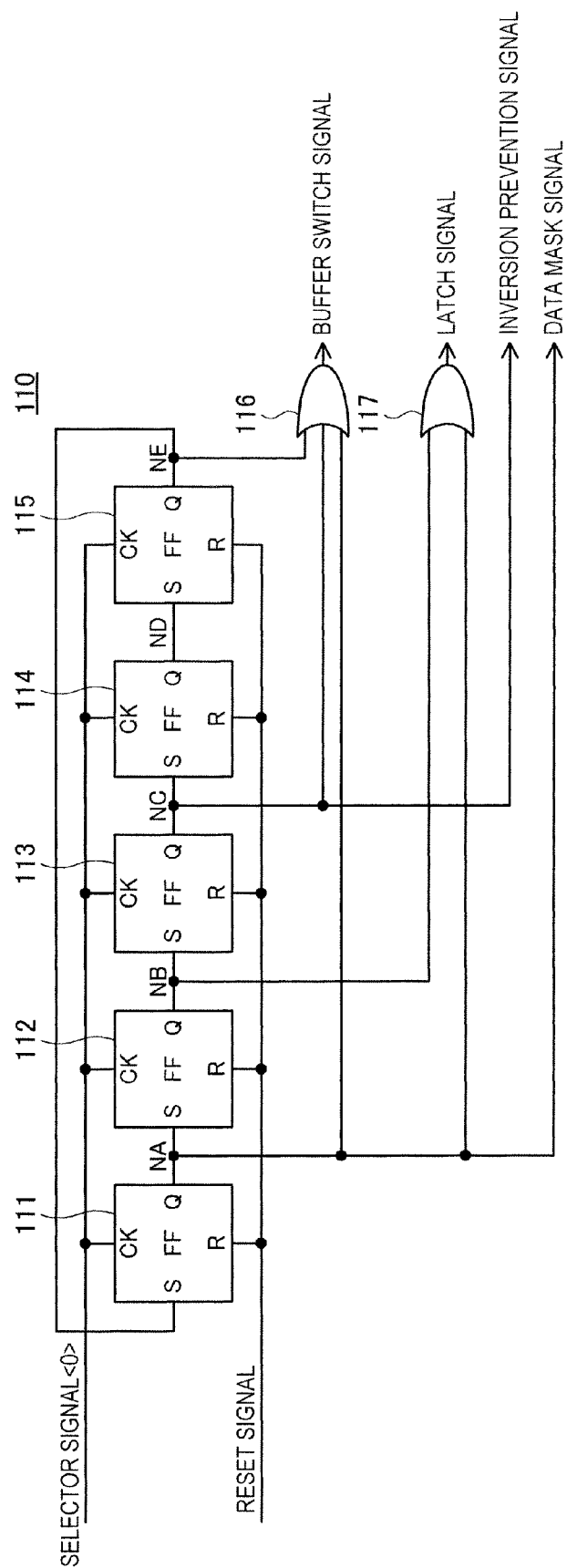
FIG. 11 shows an internal configuration of the counter circuit 110 shown in FIG. 6.

As shown in FIG. 11, the counter circuit 110 includes synchronous SR flip-flops 111 to 115 and OR circuits 116 and 117.

Each of the synchronous flip-flops 111 to 115 includes a clock terminal CK, a set terminal S, a reset terminal R, and an output terminal Q. The selector signal <0> is supplied to the clock terminals CK of the respective synchronous flip-flops 111 to 115. A reset signal is supplied to the reset terminals R thereof. The reset signal is a signal resetting potentials of the output terminals Q of the synchronous SR flip-flops 111 to 115 to be low when being activated. The reset signal is kept inactive during the test according to the present embodiment. The synchronous SR flip-flops 111 to 115 are connected in series in this order, and the output terminal Q of the relatively front synchronous SR flip-flop is connected to the set terminal S of the relatively rear synchronous SR flip-flop. The output terminal Q of the backmost synchronous SR flip-flop 115 is connected to the set terminal S of the foremost synchronous SR flip-flop 111. Signals output from the output terminals Q of the respective synchronous flip-flops 111 to 115 are hereinafter referred to as "output signals NA to NE".

Figure 12:
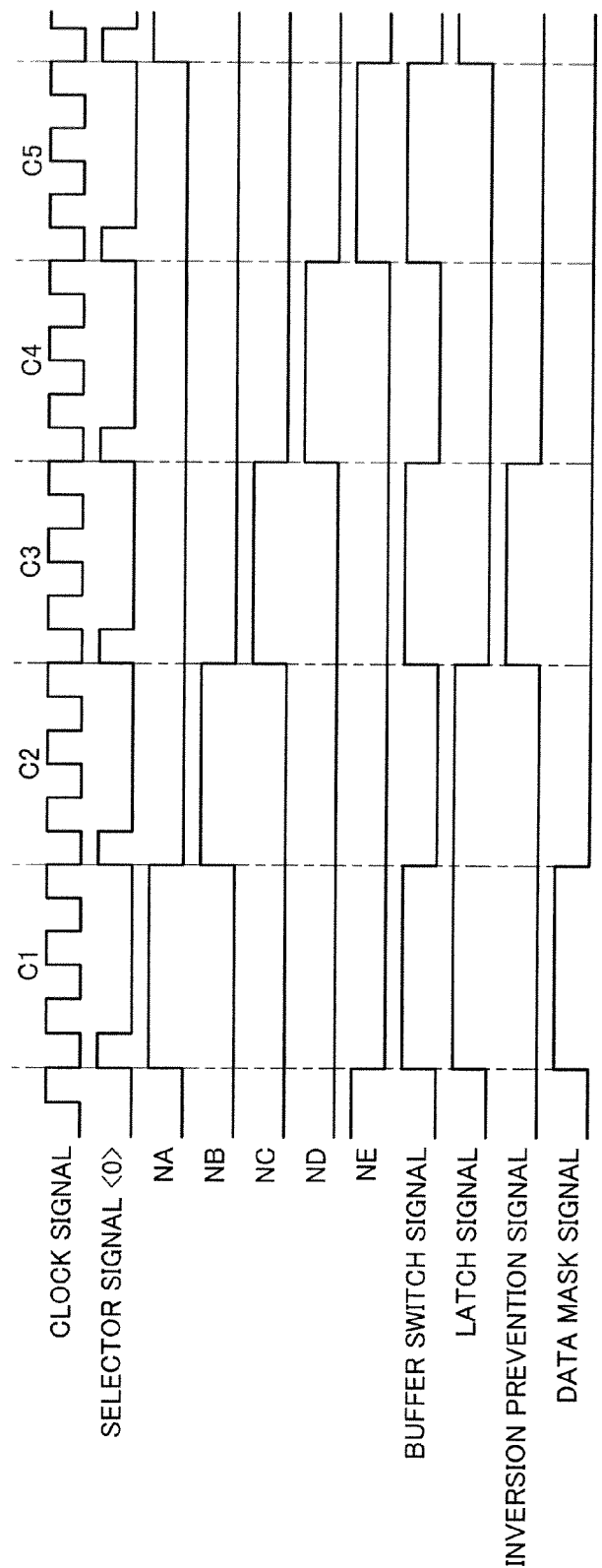
FIG. 12 is a time chart of various signals including internal signals of the counter circuit 110.

As shown in FIG. 12, the counter circuit 110 is configured so that potentials of the output signals NA to ND are low and that that of the output signal NE is high in an initial state (just before the cycle C1). The cycle C1 starts from this state. When the selector signal <0> is activated, the potential of the output signal NA becomes high and those of the output signals NB to NE become low in the cycle C1. Thereafter, with the passage of time from the cycle C1 to the cycles C2 to C5, the potentials of the output signals NB to NE sequentially become high and the other output signals become low when one of the output signals NA to NE is high.

As shown in FIG. 11, the output signal NA is used as the data mask signal as it is. Therefore, as shown in FIG. 12, the potential of the data mask signal is high in the cycle C1 and low in the cycles C2 to C5. Furthermore, as shown in FIG. 11, the output signal NC is used as the inversion prevention signal as it is. Therefore, as shown in FIG. 12, the potential of the inversion prevention signal is high in the cycle C3 and low in the cycles C1, C2, C4, and C5.

The output signals NA, NC, and NE are supplied to the OR circuit 116, and an output signal from the OR circuit 116 is used as the buffer switch signal. Therefore, as shown in FIG. 12, the potential of the buffer switch signal is high in the cycles C1, C3, and C5 and low in the cycles C2 and C4. The output signals NA and NB are supplied to the OR circuit 117, and an output signal from the OR circuit 117 is used as the latch signal. Therefore, as shown in FIG. 12, the potential of the latch signal is high in the cycles C1 and C2 and low in the cycles C3 to C5.

The transition of the output signals Oa to Oe from the first to fifth buffer circuits 102a to 102e is described with reference to FIG. 10. As a result of the transition of the values of the buffer switch signal and the latch signal explained above, potentials of the output signals Oa, Oc, and Oe are high in the cycle C1, low in the cycle C3, and low in the cycle C5 as shown in FIG. 10. In FIG. 10, a broken-line part of the potential of the signal indicates that the signal is in a high impedance state. That is, the output signals Oa, Oc, and Oe are in a high impedance state in the cycles C2 and C4. On the other hand, as shown in FIG. 10, potentials of the output signals Ob and Od are low in the cycle C2, high in the cycle C4, and in a high impedance state in the cycles C1, C3, and C5.

Referring back to FIG. 9, the selector signals <5:1> and the monitor signals <4:0> are supplied to the selector circuit 122. The selector circuit 122 functions to output a monitor signal <n−1>, where n is an integer from 0 to 5, when a selector signal <n> is activated (the potential of the selector signal <n> is high). Therefore, in the second to sixth half-clock periods in each cycle, the selector circuit 122 outputs signals indicating the potentials of the first to fifth current paths Sa to Se, respectively. The signal output from the selector circuit 122 is referred to as "monitor signal MS". When none of the selector signals <5:1> are activated, the monitor signal MS output from the selector circuit 122 can be set in high impedance state or the potential of the monitor signal MS can be fixed to either low or high.

The determination circuit 125 functions to output an abnormality determination signal indicating whether a short-circuit defect is present in each current path and a status determination signal indicating the state of the potential of each current path in response to the clock signal, the latch signal, the inversion prevention signal, and the monitor signal MS. The monitor signal MS can serve as the status determination signal, and FIG. 10 shows that the monitor signal MS is identical to the status determination signal.

Figure 13:
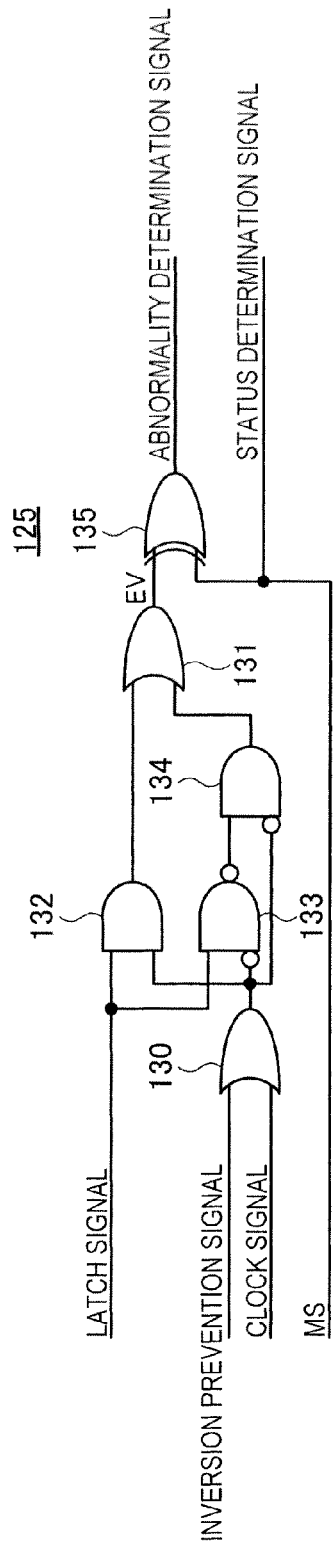
FIG. 13 shows an internal configuration of the determination circuit 125 shown in FIG. 9.

Turning to FIG. 13, the determination circuit 125 includes OR circuits 130 and 131, AND circuits 132 and 134, a NAND circuit 133, and an exclusive-OR circuit 135.

The inversion prevention signal and the clock signal are supplied to the OR circuit 130. The latch signal and an output signal from the OR circuit 130 are supplied to the AND circuit 132. The latch signal and an inversion signal of the output signal from the OR circuit 130 are supplied to the NAND circuit 133. The inversion signal of the output signal from the OR circuit 130 and an output signal from the NAND circuit 133 are supplied to the AND circuit 134. An output signal from the AND circuit 132 and an output signal from the AND circuit 134 are supplied to the OR circuit 131. An output signal EV from the OR circuit 131 and the monitor signal MS are supplied to the exclusive-OR circuit 135. An output signal from the exclusive-OR circuit 135 serves as the abnormality determination signal.

With the configuration of the determination circuit 125 described above, the output signal EV from the OR circuit 131 is equal in a logical value to the clock signal when the potential of latch signal is high and that of the inversion prevention signal is low. The output signal EV is equal in the logical value to the inversion signal of the clock signal when the potential of the latch signal is low and that of the inversion prevention signal is low. Furthermore, the potential of the output signal EV is fixed to low when the potential of the latch signal is low and that of the inversion prevention signal is high.

The potential of the output signal EV generated as described above is equal to an expected value of the monitor signal MS, that is, the potential of each current path assumed to have no short-circuit defect. To be more precise, the potential of the output signal EV in the half-clock period corresponding to a certain current path is equal to that of the current path in the half-clock period if the current path is assumed to have no short-circuit defect.

The expected value of the monitor signal MS and the potential of the output signal EV are described more specifically. In a cycle in which a certain current path is in a floating state, the expected value of the monitor signal MS corresponding to the certain current path is equal to the potential supplied to the current path just before the current path turns into the floating state. Accordingly, the potential of the output signal EV in the second half-clock period (corresponding to the first current path Sa) in the cycle C2 in which the first current path Sa is in the floating state, for example, is set equal to the high potential supplied to the first current path Sa in the first cycle C1.

Meanwhile, in a cycle in which a predetermined potential is supplied to the certain current path, the expected value of the monitor signal MS corresponding to the certain current path is equal to the predetermined potential. Accordingly, the potential of the output signal EV in the second half-clock period (corresponding to the first current path Sa) in the cycle C1 in which the high potential is supplied to the first current path Sa, for example, is set equal to the high potential supplied to the first current path Sa in the first cycle C1.

The second and fourth current paths Sb and Sd are in the floating state in the cycle C1, and the potentials of second and fourth current paths Sb and Sd are high just before the floating state. However, the potential of the output signal EV in the third and fourth half-clock periods in the cycle C1 is low. To deal with the problem, according to the present embodiment, a separately prepared unit (not shown) holds the potentials of the second and fourth current paths Sb and Sd low in a stage just before the cycle C1 as shown in FIG. 10. Specifically, switches are provided between the current paths Sb and Sd and the corresponding second and fourth latch circuits 100b and 100d (FIG. 6), respectively. These switches are turned off in the periods other than those of the cycles C1 to C5, and a separately prepared current supply unit (not shown) supplies the low potential to the current paths Sb and Sd. This enables the determination circuit 125 to determine whether a short-circuit defect is present even in the cycle C1 as described later.

The abnormality determination signal is an exclusive-OR signal between the output signal EV indicating the value (the expected value of the monitor signal MS) explained above and the monitor signal. MS. Therefore, in an example shown in FIG. 10 on the assumption of "no short-circuit defect", the potential of the output signal EV is equal to that of the monitor signal MS at least in the second to sixth half-clock periods in each cycle. As a result, a potential of the abnormality determination signal is low in these periods. Note that the abnormality determination signal indicates "normality" when the potential is low.

In the first half-clock period in each cycle, the abnormality determination signal can indicate any arbitrary value. This is because the selector circuit 123 shown in FIG. 9 operates to ignore the abnormality determination signal generated at this timing. This feature is described later in detail.

Reference is made again to FIG. 9. The abnormality determination signal and the status determination signal are structured to be output to the outside of the interface chip IF. Specifically, it suffices to output the abnormality determination signal and the status determination signal from the data output terminals 14 shown in FIG. 5 in the form of code information indicating whether a short-circuit defect is present in each current path and indicating the potential of each current path, respectively. This enables an external tester to confirm a test result.

The abnormality determination signal is also supplied to one input terminal of the OR circuit 126. An output signal from the AND circuit 128 is supplied to the other input terminal of the OR circuit 126. An output signal from the OR circuit 126 is supplied to the selector circuit 123. An inversion signal of the data mask signal and an output signal from the selector circuit 124 are supplied to an input terminal of the AND circuit 128. The output signal from the selector circuit 124 is also supplied, as a relieving determination signal, to the relieving processing circuit 140 shown in FIG. 6.

The data latch circuit 127 is configured to include five data latch circuits 127a to 127e. An output terminal of the selector circuit 123 is connected to these five data latch circuits 127a to 127e. Output terminals of the data latch circuits 127a to 127e are connected to an input terminal of the selector circuit 124.

The selector signals <5:1> are also supplied to the selector circuits 123 and 124. The selector circuit 123 selects one of the data latch circuit 127a to 127e in response to these elector signals <5:1>, and outputs the output signal from the OR circuit 126 to the selected latch circuit. Similarly, the selector circuit 124 selects one of the data latch circuits 127a to 127e in response to these selector signals <5:1>, and outputs the signal output from the selected latch circuit from an output terminal of the selector circuit 124. That is, the selector circuits 123 and 124 select the data latch circuit 127a when the selector signal <1> is activated, and select the data latch circuit 127b when the selector signal <2> is activated. This applies to the selection of the other latch circuits. However, the selector circuit 123 does not output the signal when the selector signal <0> is activated.

With the configuration described above, the relieving determination signal serves as a signal indicating per current path whether at least one short-circuit defect is detected in the periods of the cycles C1 to C5. The relieving processing circuit 140 shown in FIG. 6 executes a relieving process of replacing the current path having a short-circuit defect by a normal current path based on the relieving determination signal supplied from the monitor circuit 120.

As described above, the semiconductor device 10 can generate the abnormality determination signal indicating whether a short-circuit defect is present in each current path, the status determination signal indicating the state of the potential of each current path, and the relieving determination signal indicating whether at least one short-circuit defect is detected in each current path in the periods of the cycles C1 to C5 by the processes performed in the five cycles C1 to C5 for the five current paths Sa to Se. Furthermore, as shown in FIG. 6, all the circuits that generate these signals are provided in the interface chip IF. Therefore, it is possible to detect short-circuit defects in the current paths without providing circuits that perform the process of inverting the logical values in each core chip.

Furthermore, as explained above, the semiconductor device according to the present embodiment can achieve the effect of reducing the time required for the detecting process because the interface chip IF can be formed by high-speed transistors.

The testing method for the semiconductor device 10 according to the present embodiment is described again in more detail while attention is paid to testing procedures.

The testing procedures for testing the current paths are explained below with reference to FIG. 14 as well as FIGS. 6 and 9. It should be noted that, unlike FIG. 10, which is on the assumption that the first to fifth current paths Se to Se are all normal (have no short-circuit defects) as described above, FIG. 14 is on the assumption that short-circuit defects as shown in FIG. 6 occur.

First, in the stage just before the cycle C1 starts, the low potential is supplied to the second and fourth current paths Sb and Sd and the potentials of the second and fourth current paths Sb and Sd are fixed to the low potential. The potential of the second and fourth current paths Sb and Sd is thereby low in the cycle C1 unless short-circuits occur to these current paths Sb and Sd. That is, the expected value of the second and fourth current paths Sb and Sd is low in the cycle C1.

When the cycle C1 starts, the selector circuit 121 (FIG. 9) operates to sequentially activate the selector signals <0> to <5> at half-clock intervals. This activation is repeatedly executed in the cycles C2 to C5.

Figure 14:
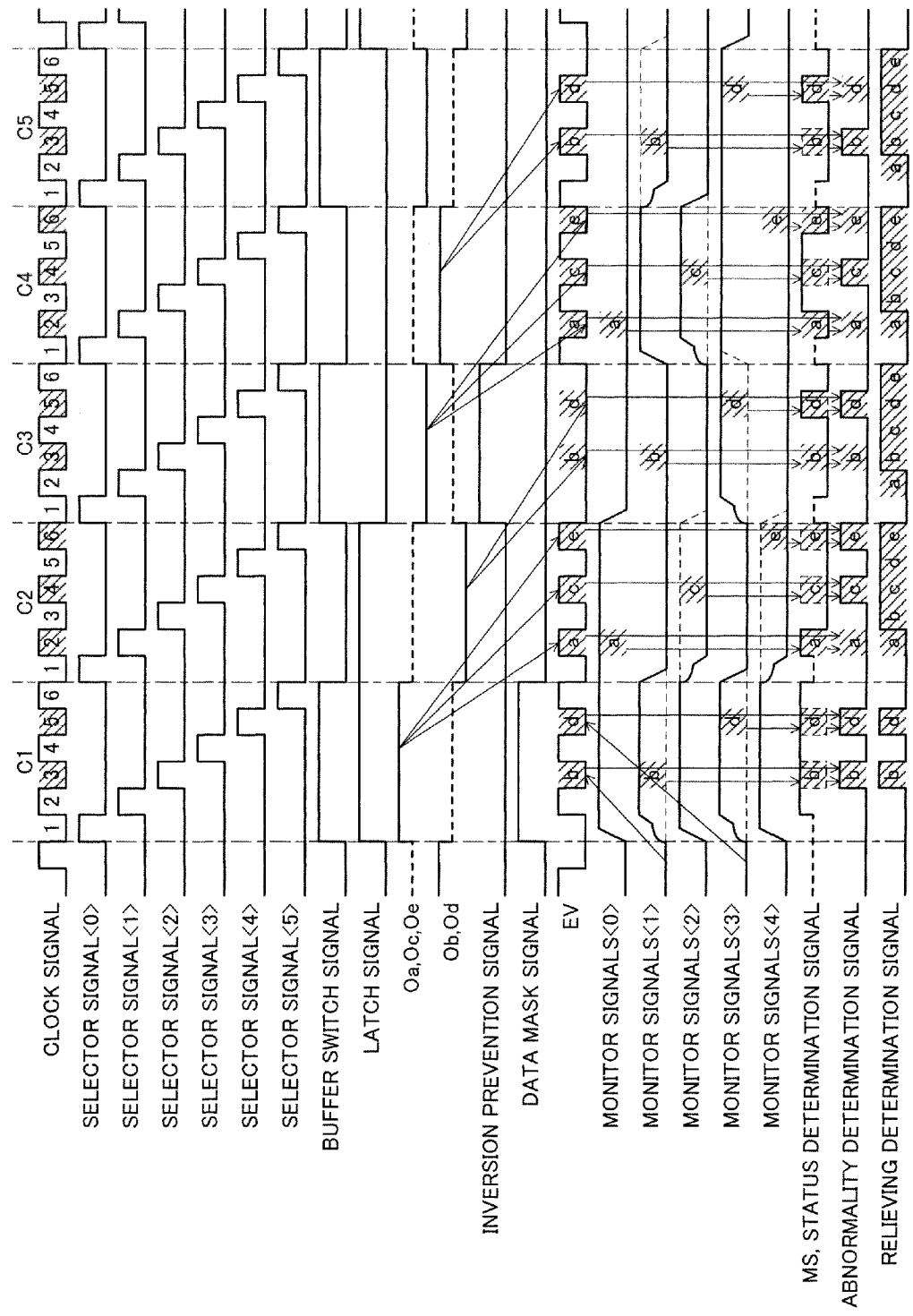
FIG. 14 is a timing chart of various signals related to the testing method.

When the selector signal <0> is activated in the cycle C1, the counter circuit 110 (FIG. 9) sets the potentials of the buffer switch signal, the latch signal, and the data mask signal to be high, and sets the potential of the inversion prevention signal to be low as shown in FIG. 14. In response to this, the driver circuit 101 (FIG. 6) sets the potentials of the output signals Oa, Oc, and Oe to be high and the output signals Ob and Od in a high impedance state during the cycle C1. Therefore, the high potential is supplied to the first, third, and fifth current paths Sa, Sc, and Se whereas the second and fourth current paths Sb and Sd are in a floating state. Furthermore, the output signal EV from the OR circuit 131 is equal in the logical value to the clock signal in the cycle C1.

In the cycle C1, the potentials of the monitor signals <0>, <2>, and <4> become high as shown in FIG. 14. This corresponds to the high potential of the output signals Oa, Oc, and Oe. On the other hand, the potentials of the monitor signals <1> and <3> become high a little late. This corresponds to the presence of the short-circuit defect between the second and third current paths Sb and Sc and that between the fourth current path Sd and the power supply wiring, as shown in FIG. 6. Therefore, in the cycle C1 shown in the example of FIG. 14, the output signal EV does not match the monitor signal MS and the potential of the abnormality determination signal becomes high in the third and fifth half-clock periods. In the subsequent cycles C2 to C5, the potential of the relieving determination signal is fixed to the high potential in the third and fifth half-clock periods as shown in FIG. 14.

Next, when the selector signal <0> is activated in the cycle C2, the counter circuit 110 (FIG. 9) sets the potential of the latch circuit to be high, and sets the potentials of the buffer switch signal, the inversion prevention signal, and the data mask signal to be low as shown in FIG. 14. In response to this, the driver circuit 101 (FIG. 6) sets the output signals Oa, Oc, and Oe in a high impedance state and the potentials of the output signals Ob and Od to be low during the cycle C2. Therefore, the first, third, and fifth current paths Sa, Sc, and Se are in a floating state whereas the low potential is supplied to the second and fourth current paths Sb and Sd. Furthermore, the output signal EV from the OR circuit 131 is equal in the logical value to the clock signal in the cycle C2 continuous to the cycle C1.

In the cycle C2, the potentials of both the monitor signals <1> and <3> become low as shown in FIG. 14. This corresponds to the low potential of the output signals Ob and Od. Furthermore, the potential of the monitor signal <0> is high. This corresponds to the high potential of the output signal Oa in the cycle C1. On the other hand, the potentials of the monitor signals <2> and <4> become low a little late. This corresponds to the presence of the short-circuit defect between the second and third current paths Sb and Sc and that between the fifth current path Se and the ground wiring, as shown in FIG. 6. Therefore, in the cycle C2 shown in the example of FIG. 14, the output signal EV does not match the monitor signal MS and the potential of the abnormality determination signal becomes high in the fourth and sixth half-clock periods. In the subsequent cycles C3 to C5, the potential of the relieving determination signal is fixed to the high potential in the fourth and sixth half-clock periods as shown in FIG. 14.

When the selector signal <0> is activated in the cycle C3, the counter circuit 110 (FIG. 9) sets the potentials of the buffer switch signal and the inversion prevention signal to be high and those of the latch signal and the data mask signal to be low as shown in FIG. 14. In response to this, the driver circuit 101 (FIG. 6) sets the potentials of the output signals Oa, Oc, and Oe to be low and the output signals Ob and Od in a high impedance state during the cycle C3. Therefore, the low potential is supplied to the first, third, and fifth current paths Sa, Sc, and Se whereas the second and fourth current paths Sb and Sd are in a floating state. Furthermore, the potential of the output signal EV from the OR circuit 131 is fixed to the low potential.

In the cycle C3, the potentials of the monitor signals <0>, <2>, and <4> become low as shown in FIG. 14. This corresponds to the low potential of the output signals Oa, Oc, and Oe. Furthermore, the monitor signal <1> becomes low. This corresponds to the presence of the short-circuit defect between the second current path Sb and the third current path Sc to which the low potential is supplied as well as the low potential of the output signal Ob in the cycle C2. On the other hand, the potential of the monitor signal <3> becomes high a little late. This corresponds to the presence of the short-circuit defect between the fourth current paths Sd and the power supply wiring, as shown in FIG. 6. Therefore, in the cycle C3 shown in the example of FIG. 14, the output signal EV does not match the monitor signal MS and the potential of the abnormality determination signal becomes high in the fifth half-clock period. The potential of the relieving determination signal has no change in the cycle C3 because the potential is already high in the fifth half-clock period in the cycle C1.

When the selector signal <0> is activated in the cycle C4, the counter circuit 110 (FIG. 9) sets the potentials of all the buffer switch signal, the latch signal, the inversion prevention signal, and the data mask signal to be low as shown in FIG. 14. In response to this, the driver circuit 101 (FIG. 6) sets the output signals Oa, Oc, and Oe in a high impedance state and the potentials of the output signals Ob and Od to be high according during the cycle C4. Therefore, the first, third, and fifth current paths Sa, Sc, and Se are in a floating state whereas the high potential is supplied to the second and fourth current paths Sb and Sd. Furthermore, the output signal EV from the OR circuit 131 is equal in the logical value to the inversion signal of the clock signal in the cycle C4.

In the cycle C4, the potentials of both the monitor signals <1> and <3> become high as shown in FIG. 14. This corresponds to the high potential of the output signals Ob and Od. Furthermore, the potential of the monitor signal <0> is low. This corresponds to the low potential of the output signal Oa in the cycle C3. Further, the potential of the monitor signal <4> is low. This corresponds to the presence of the short-circuit defect between the fifth current path Se and the ground wiring as well as the low potential of the output signal Oe in the cycle C3. On the other hand, the potential of the monitor signal <2> becomes high a little late. This corresponds to the presence of the short-circuit defect between the second and third current paths Sb and Sc as shown in FIG. 6. Therefore, in the cycle C4 shown in the example of FIG. 14, the output signal EV does not match the monitor signal MS and the potential of the abnormality determination signal becomes high in the fourth half-clock period. The potential of the relieving determination signal has no change in the cycle C4 because the potential is already high in the fourth half-clock period in the cycle C2.

Finally, when the selector signal <0> is activated in the cycle C5, the counter circuit 110 (FIG. 9) sets the potential of the buffer switch signal to be high and those of the latch signal, the inversion prevention signal, and the data mask signal to be low as shown in FIG. 14. In response to this, the driver circuit 101 (FIG. 6) sets the potentials of the output signals Oa, Oc, and Oe to be low and the output signals Ob and Od in a high impedance state during the cycle C5. Therefore, the high potential is supplied to the first, third, and fifth current paths Sa, Sc, and Se whereas the second and fourth current paths Sb and Sd are in a floating state. Furthermore, the output signal EV from the OR circuit 131 is equal in the logical value to the inversion signal of the clock signal in the cycle C5 continuous to the cycle C4.

In the cycle C5, the potentials of the monitor signals <0>, <2>, and <4> become low as shown in FIG. 14. This corresponds to the low potential of the output signals Oa, Oc, and Oe. Furthermore, the potential of the monitor signal <3> becomes high. This corresponds to the presence of the short-circuit defect between the fourth current path Sd and the power supply wiring as well as the high potential of the output signal Od in the cycle C4. On the other hand, the potential of the monitor signal <1> becomes low a little late. This corresponds to the presence of the short-circuit defect between the second current path Sb and the third current path Sc to which the low potential is supplied as shown in FIG. 6. Therefore, in the cycle C5 shown in the example of FIG. 14, the output signal EV does not match the monitor signal MS and the potential of the abnormality determination signal becomes high in the third half-clock period. The potential of the relieving determination signal has no change in the cycle C5 because the potential is already high in the fourth half-clock period in the cycle C1.

As described above, the testing method for the semiconductor device 10 according to the present embodiment enables the processes in the five cycles C1 to C0 to generate the abnormality determination signal, the status determination signal, and the relieving determination signal for the five paths Sa to Se.

The testing method for the semiconductor device 10 according to the present embodiment also enables identifying the type of short-circuit defects to some extent by referring to the abnormality determination signal. This identifying process is described below in detail.

Table 2 shows the potentials of the respective current paths in each cycle and conceivable types of short-circuit defects when it is determined that an abnormality occurs. In Table 2, "VDD" represents a short-circuit defect between a current path and the power supply wiring, "VSS" represents a short-circuit defect between a current path and the ground wiring, and "Adj" represents a short-circuit defect between a current path and an adjacent current path.

TABLE 2

|    | C1       | C2         | C3          | C4        | C5         |
|----|----------|------------|-------------|-----------|------------|
| Sa | —        | Fixed to H | VSS/ Adj    | Fixed to L| VDD/ Adj   |
| Sc |          |            |             |           | Fixed to L |
| Se |          |            |             |           |            |
| Sb | Fixed to L | VDD/ Adj | Fixed to L  | VDD       | Fixed to H | VSS/ Adj |
| Sd |          |            |             |           |            |

Table 2 is explained while referring to an example of FIG. 14. First, the fourth current path Se is determined to be abnormal in the cycles C1 and C3 and to be normal in the cycle C5. Based on the determination results in the cycles C1 and C3, it is considered that either a short-circuit defect between the fourth current path Se and the power supply wiring or that between the fourth current path Se and the adjacent current path possibly occurs. But, if the short-circuit defect occurs between the fourth current path Se and the adjacent current path, the fourth current path Se is supposed to be determined to be abnormal in the cycle C5, too. Therefore, it is highly likely that the fourth current path Se has a short-circuit defect between itself and the power supply wiring.

Next, the second current path Sb is determined to be abnormal in the cycles C1 and C5 and to be normal in the cycle C3. Based on the determination results in the cycles C1 and C5, it is considered that any type of short-circuit defects possibly occurs. But, if the short-circuit occurs between the second current path Sb and the power supply wiring, the second current path Sb is also supposed to be determined to be abnormal in the cycle C3. Therefore, it is unlikely that the short-circuit defect occurs between the second current path Sb and the power supply wiring. It is instead highly likely that the short-circuit defect occurs between the second current path Sb and the adjacent current path because the second current path Sb is determined to be abnormal in the cycle C1. Furthermore, is unlikely that the short-circuit defect occurs between the second current path Sb and the ground wiring because the probability of simultaneous occurrence of two or more types of short-circuit defects is low.

Next, the first current path Sa is determined to be normal in both the cycles C2 and C4. Therefore, it is highly likely that the first current path Sa has no short-circuit defect.

Next, the third current path Sc is determined to be abnormal in the cycles C2 and C4. Therefore, while it is considered that any type of short-circuit defects possibly occurs, because of the low probability of the simultaneous occurrence of two or more types of short-circuit defects as described above, it is highly likely that a short-circuit defect occurs between the third current path Sc and the adjacent current path. This estimate matches the high probability of the short-circuit defect between the second current path Sb and the adjacent current path.

Finally, the fifth current path Se is determined to be abnormal in the cycle C2 and to be normal in the cycle C4. Based on the determination result in the cycle C2, it is considered that either a short-circuit defect between the fifth current path Se and the ground wiring or that between the fifth current path Se and the adjacent current path possibly occurs. If the short-circuit defect occurs between the fifth current path Se and the adjacent current path, however, the fifth current path Se is also supposed to be determined to be abnormal in the cycle C4. Therefore, it is highly likely that the short-circuit occurs between the fifth current path Se and the ground wiring.

As described above, the testing method for the semiconductor device 10 according to the present embodiment further enables identifying the type of short-circuit defects to some extent by referring to the abnormality determination signal.

While a preferred embodiment of the present invention has been explained above, the invention is not limited to the above embodiment, and various modifications can be made without departing from the spirit of the present invention, and it is needless to mention that such modifications are also included in the scope the invention.

For example, various combinations and selections of the components disclosed herein may be made within the scope of the invention. In other words, the present invention of course includes various changes and modifications that are obvious to those skilled in the art according to all the disclosure including the claims and the technical concept.

Also, in the embodiment, the DDR3-type SDRAMs are used as the plural core chips having the same function. However, the present invention is not limited thereto. Accordingly, the core chip may be a DRAM other than the DDR3-type or a semiconductor memory (SRAM (Static Random Access Memory), PRAM (Phase-change Random Access Memory), MRAM (Magnetic Random Access Memory) or a flash memory, for example) other than the DRAM. The core chips may be plural semiconductor chips that have functions other than the functions of the semiconductor memory, which are equal to or different from each other. All of the core chips do not need to be laminated and all or part of the core chips may be two-dimensionally disposed. The number of core chips is not restricted to 8.

The core chips have been described as chips of semiconductor memories having the same function. However, the fundamental technical concept of the present invention is not limited to that, and the core chips may have the same function as one another or different functions from one another. Specifically, the interface chip and the core chips may be silicon chips each having a unique function. For example, the core chips may be DSP chips having the same function, and may have an interface chip (ASIC) shared among the core chips. Preferably, the core chips have the same function as one another, and are manufactured with the use of the same mask. However, the characteristics after the manufacture might vary due to the in-plane distribution in the same wafer, differences among wafers, differences among lots, and the likes. Further, the core chips each have a memory function, but may also have different functions from one another (a first core chip is a DRAM, a second chip is a SRAM, a third chip is a nonvolatile memory, and a fourth chip is a DSP). The core chips may be manufactured with the use of different manufacturing masks from one another, and may have an interface chip (ASIC) shared among the core chips.

The present invention may also be applied to all semiconductor products such as CPUs (Central Processing Units), MCUs (Micro Control Units), DSPs (Digital Signal Processors), ASICs (Application Specific Integrated Circuits), and ASSPs (Application Specific Standard Products), as long as they are COCs (Chip-on-Chips) that use TSVs. The devices to which the present invention is applied may also be used as the semiconductor devices in SOCs (System-on-Chips), MCPs (Multi Chip Packages), POPs (Package-On-Packages), and the likes. The transistors may be field effect transistors (FETs) or bipolar transistors. The present invention may be applied to various kinds of FETs such as MISs (Metal-Insulator Semiconductors) and TFTs (Thin Film Transistors), other than MOSs (Metal Oxide Semiconductors). The present invention may be applied to various kinds of FETs such as transistors. The transistors may be other transistors than FETs. The transistors may partially include bipolar transistors. Also, p-channel transistors or PMOS transistors are typical examples of the transistors of the first conductivity type, and n-channel transistors or NMOS transistors are typical examples of the transistors of the second conductivity type. Further, the substrate may not necessarily be a p-type semiconductor substrate, and may be an n-type semiconductor substrate, or a semiconductor substrate of a SOI (Silicon on Insulator) structure, or a semiconductor substrate of some other type.

Further, the circuit forms of various test circuits (such as latch circuits, a driver circuit, a control circuit, a monitor circuit) are not limited to the circuit forms disclosed in the embodiments.

Further, the structures of TSVs are not particularly limited.

What is claimed is:

1. A device comprising:
    first and second current path lines each including at least one penetration electrode penetrating through a semiconductor substrate;
    first and second latch circuits coupled to the first and second current path lines, respectively;
    a driver circuit supplying first and second data to the first and second latch circuits, respectively, the second data representing a logical value opposite to a logical value of the first data;
    a control circuit controlling the driver circuit so that first and second periods are alternately repeated, the driver circuit supplying the first data to the first latch circuit without supplying the second data to the second latch circuit in the first period, and the driver circuit supplying the second data to the second latch circuit without supplying the first data to the first latch circuit in the second period; and
    a monitor circuit determining whether a logical value of a potential of the first current path line in the second period is equal to the logical value of the first data in a preceding first period, and whether a logical value of a potential of the second current path line in the first period is equal to the logical value of the second data in a preceding second period.

2. The device as claimed in claim 1, wherein
    the driver circuit includes:
        a first buffer circuit having a first output terminal coupled to the first current path line; and
        a second buffer circuit having a second output terminal coupled to the second current path line,
    the control circuit includes:
        a counter circuit supplying a buffer switch signal to the first buffer circuit, the buffer switch signal indicating a first logical value in the first period and indicating a second logical value different from the first logical value in the second period; and
        a first inverter circuit generating an inversion signal of the buffer switch signal and supplies the inversion signal to the second buffer circuit,
    the first buffer circuit outputs the first data from the first output terminal when the buffer switch signal indicates the first logical value, and brings the first output terminal into a high impedance state when the buffer switch signal indicates the second logical value, and
    the second buffer circuit outputs the second data from the second output terminal when the inversion signal indicates the first logical value, and brings the second output terminal into a high impedance state when the inversion signal indicates the second logical value.

3. The device as claimed in claim 2, wherein the driver circuit further includes a second inverter circuit generating the second data obtained by inverting the first data.

4. The device as claimed in claim 1, wherein
    the monitor circuit generates an expected value representing, in the second period, a logical value equal to the logical value of the first data in the preceding first period, and representing, in the first period, a logical value equal to the logical value of the second data in the preceding second period, and
    the monitor circuit compares the expected value with logical values of the potentials of the first and second current path lines to determine whether a logical value of a potential of the first current path line in the second period is equal to the logical value of the first data in the preceding first period, and whether a logical value of a potential of the second current path line in the first period is equal to the logical value of the second data in the preceding second period.

5. The device as claimed in claim 1, further comprising an interface chip and a core chip electrically connected to each other by the first and second current path lines,
    wherein the first and second latch circuits, the driver circuit, the control circuit, and the monitor circuit are provided in the interface chip.

6. The device as claimed in claim 1, further comprising:
    third to fifth current path lines each including at least one penetration electrode penetrating through the semiconductor substrate; and
    third to fifth latch circuits coupled to the third to fifth current path lines, respectively, wherein
    the driver circuit further supplies the first data to the third and fifth latch circuits, and further supplies the second data to the fourth latch circuit,
    the control circuit further controls the driver circuit so that the driver circuit supplies the first data to the third and fifth latch circuits without supplying the second data to the fourth latch circuit in the first period, and the driver circuit supplies the second data to the fourth latch circuit without supplying the first data to the third and fifth latch circuits in the second period, and
    the monitor circuit determines whether a logical value of a potential of each of the third and fifth path lines in the second period is equal to the logical value of the first data in the preceding first period, and whether a logical value of a potential of the fourth current path line in the first period is equal to the logical value of the second data in the preceding second period.

7. The device as claimed in claim 6, wherein
    the driver circuit further includes:
        a third buffer circuit having a third output terminal coupled to the third current path line;
        a fourth buffer circuit having a fourth output terminal coupled to the fourth current path line; and
        a fifth buffer circuit having a fifth output terminal coupled to the fifth current path line,
    the first, third, and fifth buffer circuits output the first data from the first, third, and fifth output terminals, respectively, when the buffer switch signal indicates the first logical value, and bring the first, third, and fifth output terminals into a high impedance state when the buffer switch signal indicates the second logical value, and the second and fourth buffer circuits output the second data from the second and fourth output terminals, respectively, when an inversion signal of the buffer switch signal indicates the first logical value, and bring the second and fourth output terminals into a high impedance state when the inversion signal of the buffer switch signal indicates the second logical value.

8. The device as claimed in claim 7, wherein the control circuit defines each of first, third, and fifth cycles as the first period, and defines each of second and fourth cycles as the second period, the first to fifth cycles appearing in this order on a time axis, and the first data represents the first logical value in the first and second cycles, and represents the second logical value in the third to fifth cycles.

9. The device as claimed in claim 8, wherein the monitor circuit determines whether, in the second and fourth cycles, logical values of the potentials of the first, third, and fifth current path lines are equal to the logical value of the first data in the first and third cycles, respectively, and whether, in the third and fifth cycles, logical values of the potentials of the second and fourth current path lines are equal to the logical value of the second data in the second and fourth cycles, respectively.

10. The device as claimed in claim 9, wherein the logical values of the potentials of the second and fourth current path lines are controlled to be the second logical value prior to the first cycle, and the monitor circuit determines whether the logical values of the second and fourth current path lines are equal to the second logical value in the first cycle.

11. The device as claimed in claim 6, wherein the monitor circuit generates an expected value representing, in the second period, a logical value equal to the logical value of the first data in the preceding first period, and representing, in the first period, a logical value equal to the logical value of the second data in the preceding second period, and the monitor circuit compares the expected value with the logical values of the potentials of the first, third, and fifth current path lines in the second period, and compares the expected value with the logical values of the potentials of the second and fourth current path lines in the first period.

12. The device as claimed in claim 6, further comprising an interface chip and a core chip electrically connected to each other by the first to fifth current path lines, wherein the first to fifth latch circuits, the driver circuit, the control circuit, and the monitor circuit are provided in the interface chip.

13. A method comprising:

providing a semiconductor device including first and second current path lines each including at least one penetration electrode penetrating through a semiconductor substrate, and first and second latch circuits coupled to the first and second current path lines, respectively;

supplying a first data to the first latch circuit in a first cycle;

stopping supplying the first data to the first latch circuit to bring the first path line into a floating state, and supplying a second data to the second latch circuit in a second cycle subsequent to the first cycle, the second data representing a logical value opposite to a logical value of the first data;

stopping supplying the second data to the second latch circuit to bring the second current path line into a floating state in a third cycle subsequent to the second cycle;

determining, in the second cycle, whether a logical value of a potential of the first current path line is equal to the logical value of the first data in the first cycle; and determining, in the third cycle, whether a logical value of a potential of the second current path line is equal to the logical value of the second data in the second cycle.

14. The method as claimed in claim 13, wherein the semiconductor device further includes third to fifth current path lines each including at least one penetration electrode penetrating through the semiconductor substrate, and third to fifth latch circuits coupled to the third to fifth current path lines, respectively, the method further comprises:

supplying the first data to the third and fifth latch circuits in the first cycle;

stopping supplying the first data to the third and fifth latch circuits to bring the third and fifth current path lines into a floating state, and supplying the second data to the fourth latch circuit in the second cycle;

stopping supplying the second data to the fourth latch circuit to bring the fourth current path line into a floating state in the third cycle;

determining, in the second cycle, whether a logical value of a potential of each of the third and fifth path lines is equal to the logical value of the first data in the first cycle; and determining, in the third cycle, whether a logical value of a potential of the fourth current path line is equal to the logical value of the second data in the second cycle.

15. The method as claimed in claim 11, further comprising:

supplying the first data to the first, third, and fifth latch circuits in the third cycle;

stopping supplying the first data to the first, third, and fifth latch circuits to bring the first, third, and fifth current path lines into a floating state, and supplying the second data to the second and fourth latch circuits in a fourth cycle subsequent to the third cycle;

supplying the first data to the first, third, and fifth latch circuits, and stopping supplying the second data to the second and fourth latch circuits to bring the second and fourth current path lines into a floating state in a fifth cycle subsequent to the fourth cycle;

determining, in the fourth cycle, whether the logical value of the potential of each of the first, third, and fifth current path lines is equal to the logical value of the first data in the third cycle; and determining, in the fifth cycle, whether the logical value of the potential of each of the second and fourth current path lines is equal to the logical value of the second data in the fourth cycle.

16. The method as claimed in claim 15, wherein the logical value of the potential of each of the second and fourth current path lines is controlled to be equal to the second logical value prior to the first cycle, and the method further comprises determining whether the logical value of the potential of each of the second and fourth current path lines is equal to the second logical value in the first cycle.

17. The method as claimed in claim 15, wherein the first data represents the first logical value in the first and second cycles, and represents the second logical value in the third to fifth cycles.

18. A device comprising:
- a plurality of terminals, the terminals being classified into first and second groups each including at least one of the terminals;
- a plurality of storage circuits each coupled to an associated one of the terminals and configured to hold a voltage level related to a logic level appearing at the associated one of the terminals;
- a driver configured to drive the terminals with first and second patterns, the first pattern comprising the first group being driven with one of first and second logic levels while bringing the second group into an eclectically floating state, the second pattern comprising the second group being driven with the other of the first and second logic levels while bringing the first group into an eclectically floating state, the driver being configured to execute one of first and second patterns at least once and the other of the first and second patterns at least twice with an intervention of execution of the one of the first and second patterns; and
- a monitor circuit configured to monitor a voltage level at each of the terminals.

19. The device as claimed in claim 18, wherein the device comprises first and second semiconductor chips; the first semiconductor chips comprising the terminals, the storage circuits, the driver and the monitor circuit; the second semiconductor chips comprising a plurality of penetration electrodes each penetrating a semiconductor substrate of the second semiconductor chip; and the terminals of the first semiconductor chip being electrically connected to the penetration electrodes of the second semiconductor chip, respectively.

20. The device as claimed in claim 19, wherein the device further comprises a third semiconductor chip, the third semiconductor chips comprising a plurality of penetration electrodes each penetrating a semiconductor substrate of the third semiconductor chip, the third semiconductor chip being stacked over the second semiconductor chip with the penetration electrodes of the third semiconductor chip being electrically connected to the penetration electrodes of the second semiconductor chip, respectively.

* * * * *